United States Patent
Hsieh et al.

(10) Patent No.: US 12,243,894 B2
(45) Date of Patent: Mar. 4, 2025

(54) STACKED IMAGE SENSORS AND METHODS OF FORMATION

(71) Applicant: Taiwan Semiconductor Manufacturing Company, Ltd., Hsinchu (TW)

(72) Inventors: Feng-Chien Hsieh, Pingtung (TW); Yun-Wei Cheng, Taipei (TW); Wei-Li Hu, Tainan (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 395 days.

(21) Appl. No.: 17/662,909

(22) Filed: May 11, 2022

(65) Prior Publication Data

US 2023/0369369 A1 Nov. 16, 2023

(51) Int. Cl.
*H01L 27/146* (2006.01)
*H01L 25/065* (2023.01)

(52) U.S. Cl.
CPC .... *H01L 27/14634* (2013.01); *H01L 25/0652* (2013.01); *H01L 27/14612* (2013.01); *H01L 27/14643* (2013.01); *H01L 27/1469* (2013.01)

(58) Field of Classification Search
None
See application file for complete search history.

(56) References Cited

U.S. PATENT DOCUMENTS

| | | | |
|---|---|---|---|
| 11,594,395 B2 | 2/2023 | Wang et al. | |
| 2015/0123173 A1 | 5/2015 | He | |
| 2015/0303233 A1* | 10/2015 | Borthakur | H01L 27/14636 348/294 |
| 2021/0134557 A1 | 5/2021 | Wang et al. | |
| 2023/0353896 A1* | 11/2023 | Cowley | H01L 27/14636 |

FOREIGN PATENT DOCUMENTS

| | | |
|---|---|---|
| TW | 201942940 A | 11/2019 |
| TW | 202205342 A | 2/2022 |

* cited by examiner

*Primary Examiner* — Anthony Ho
(74) *Attorney, Agent, or Firm* — Harrity & Harrity, LLP

(57) ABSTRACT

Some implementations described herein provide pixel sensor configurations and methods of forming the same. In some implementations, one or more transistors of a pixel sensor are included on a circuitry die (e.g., an application specific integrated circuit (ASIC) die or another type of circuitry die) of an image sensor device. The one or more transistors may include a source follower transistor, a row select transistor, and/or another transistor that is used to control the operation of the pixel sensor. Including the one or more transistors of the pixel sensor (and other pixel sensors of the image sensor device) on the circuitry die reduces the area occupied by transistors in the pixel sensor on the sensor die. This enables the area for photon collection in the pixel sensor to be increased.

20 Claims, 29 Drawing Sheets

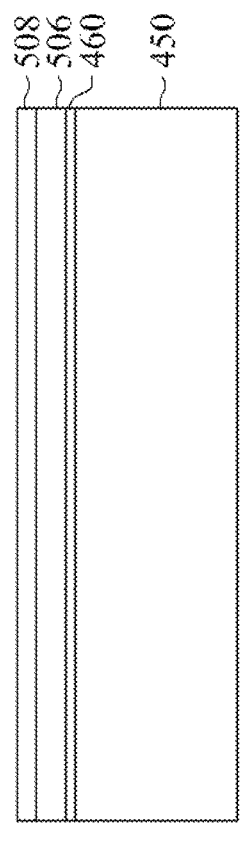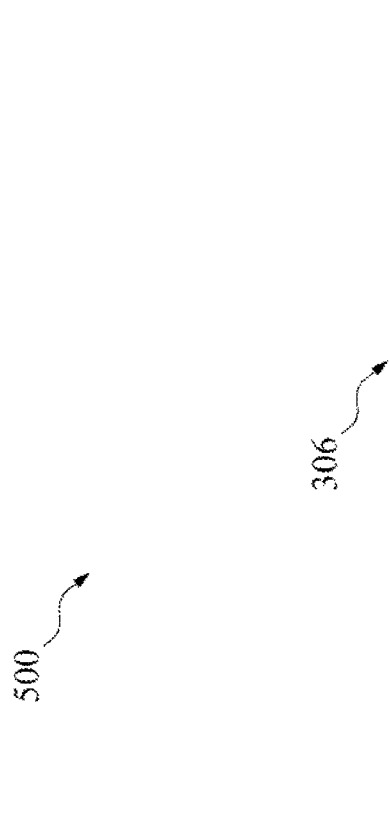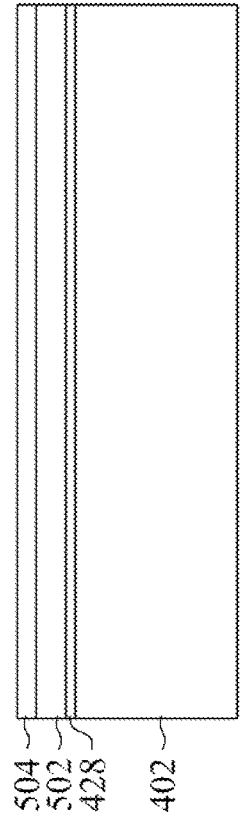
FIG. 5A
FIG. 5B

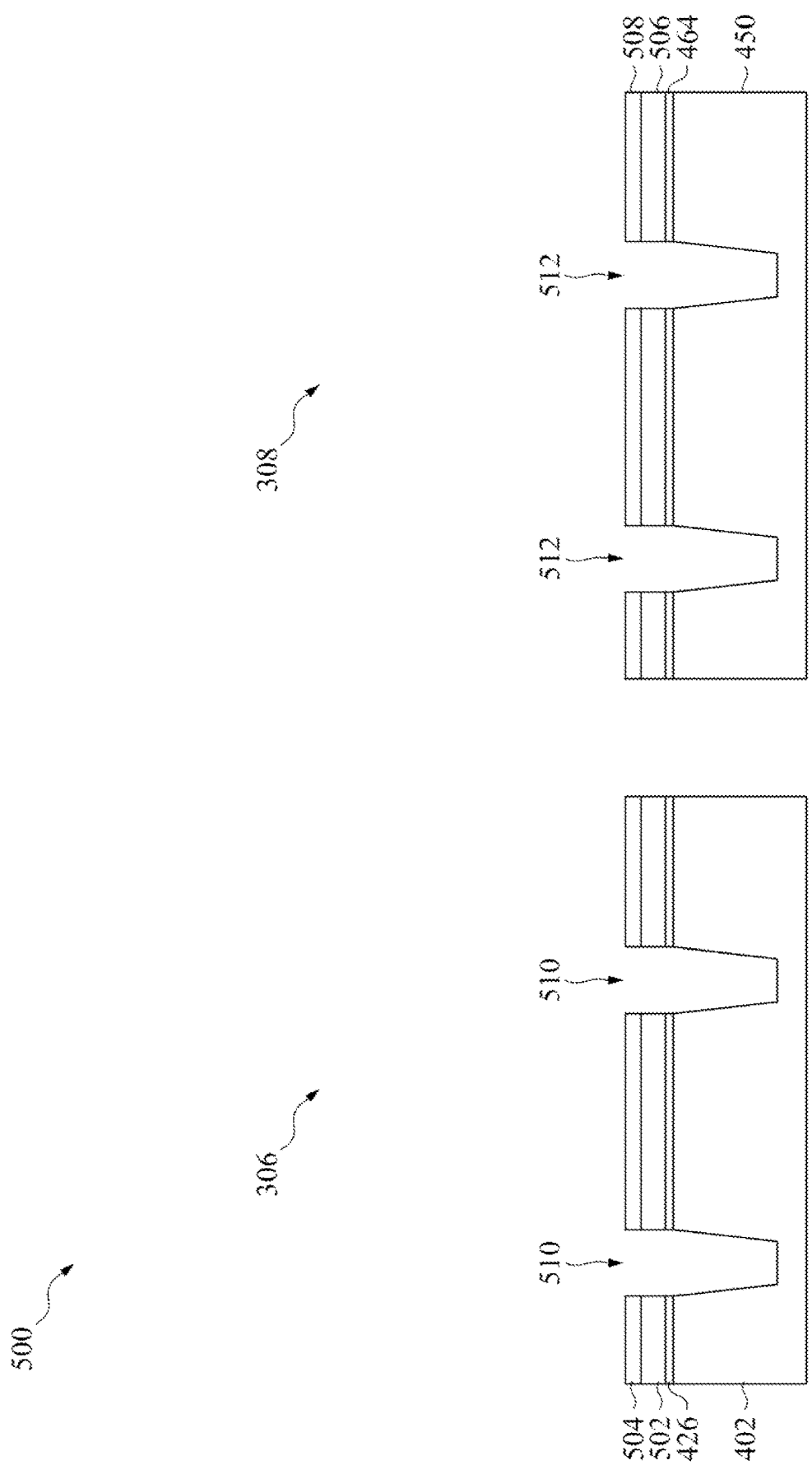

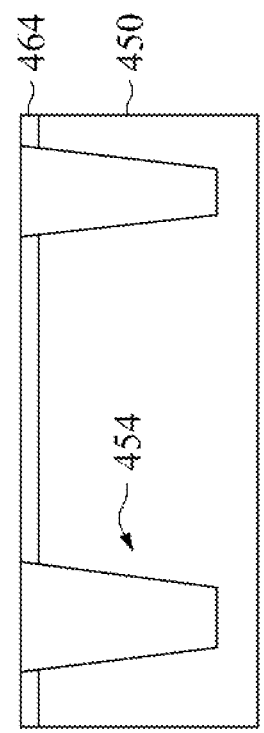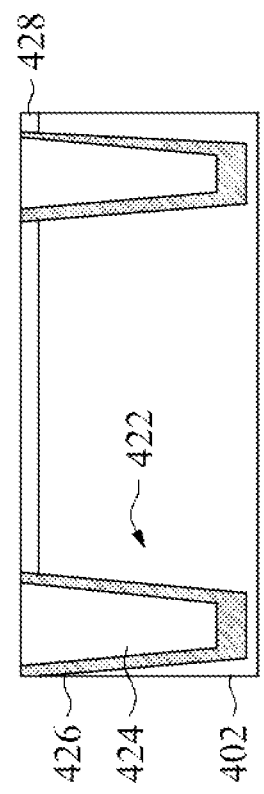
FIG. 5F
FIG. 5G

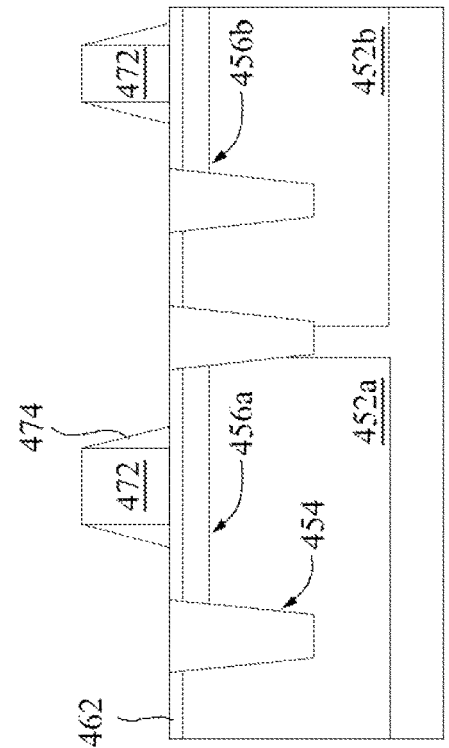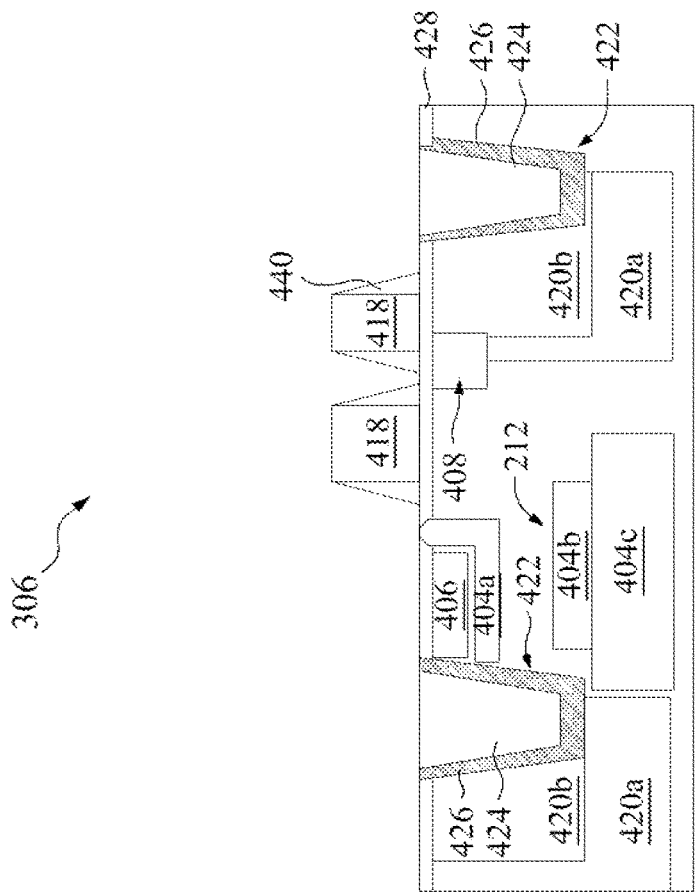
FIG. 5N
FIG. 5M

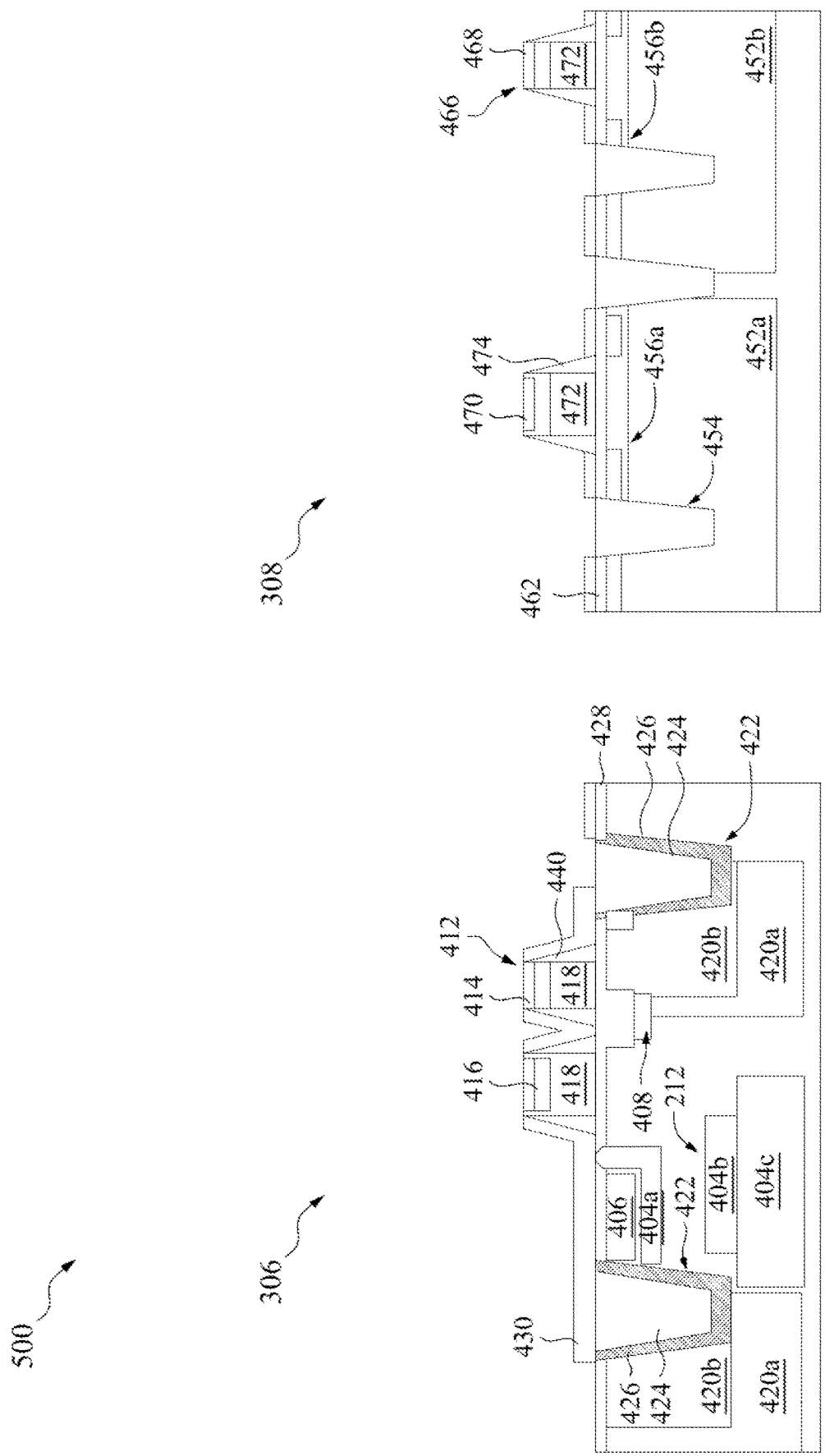

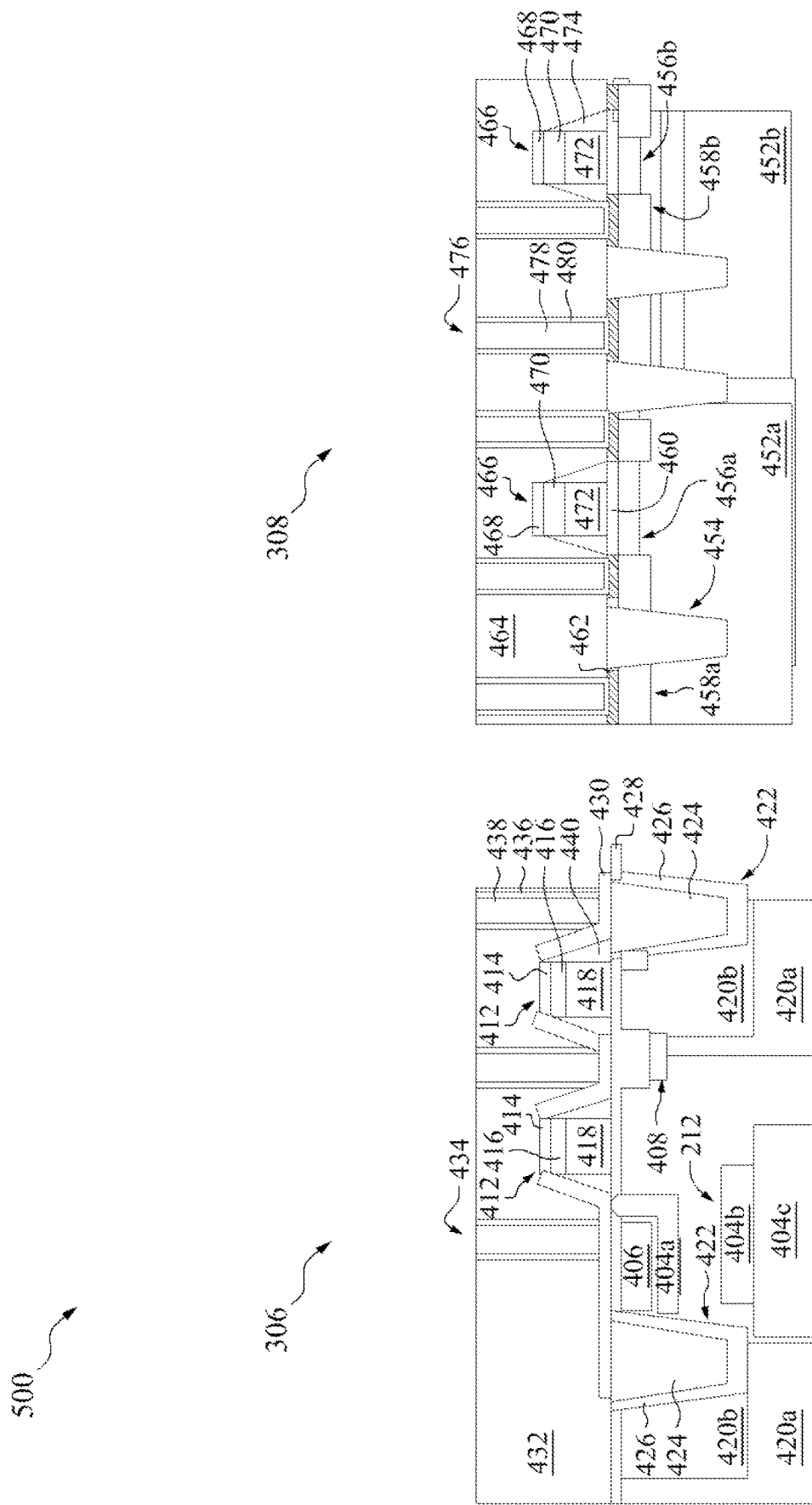

STACKED IMAGE SENSORS AND METHODS OF FORMATION

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
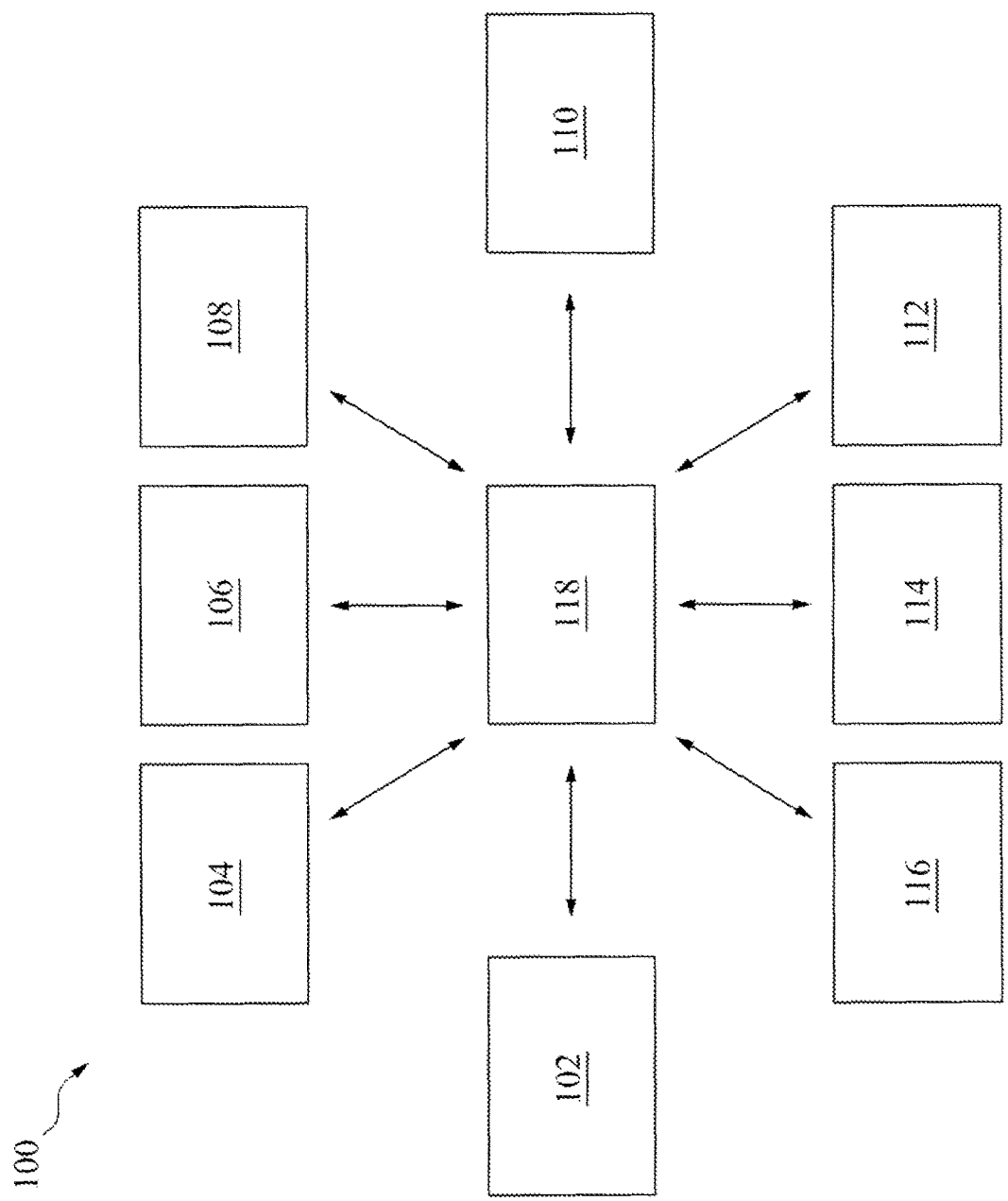
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, decreasing the size of pixel sensors in a pixel sensor array may enable reductions in size of an image sensor that includes the pixel sensor array. A reduction in the size of an image sensor may enable improved mobility applications and/or small form factor applications for the image sensor, which may include Internet of things (IoT) devices, security camera devices, and/or another type of devices. However, as the size of pixel sensors is decreased, so too is the available area for photon collection in the pixel sensors. This may lead to reduced light sensitivity and/or reduced contrast for the pixel sensors, among other examples.

Some implementations described herein provide pixel sensor configurations, and methods of forming the same, in which one or more transistors of a pixel sensor are included on a circuitry die (e.g., an application specific integrated circuit (ASIC) die or another type of circuitry die) of an image sensor device such as a three-dimensional (3D) complementary metal oxide semiconductor (CMOS) image sensor. The one or more transistors may include a source follower transistor, a row select transistor, and/or another transistor that is used to control the operation of the pixel sensor.

Prior to wafer bonding, the one or more transistors may be formed on a circuitry wafer on which the circuitry die is formed. The circuitry wafer and a sensor wafer (e.g., a wafer on which dies including pixel sensor arrays are formed) are then bonded such that the circuitry die and an associated sensor die are electrically connected to form a stacked die of the image sensor device. The bonded wafers are cut or diced into individual stacked dies and packaged.

In this way, including the one or more transistors of the pixel sensor (and other pixel sensors of the image sensor device) on the circuitry die reduces the area occupied by transistors in the pixel sensor on the sensor die. This increases the area for photon collection in the pixel sensor. The increased area for photon collection, provided by including the one or more transistors on the circuitry die, enables the size of the pixel sensor (and other pixel sensors of the image sensor device) to be reduced and/or enables increased light sensitivity and/or increased contrast for the image sensor, among other examples. Reducing the size of the pixel sensor (and other pixel sensors of the image sensor device) enables the size of the image sensor device to be reduced, which enables improved mobility and/or small form factor applications for the image sensor device.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding tool 116 is a semiconductor processing tool that is capable of bonding two or more wafers (or two or more semiconductor substrates, or two or more semiconductor devices) together. For example, the bonding tool 116 may include a eutectic bonding tool that is capable of forming a eutectic bond between two or more wafers together. In these examples, the bonding tool may heat the two or more wafers to form a eutectic system between the materials of the two or more wafers. As another example, the bonding tool 116 may include a hybrid bonding tool, a direct bonding tool, and/or another type of bonding tool.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form an image sensor device that includes a sensor die. One or more of the semiconductor processing tools 102-116 may form the sensor die to include a pixel sensor. One or more of the semiconductor processing tools 102-116 may form the pixel sensor to include a sensing region that includes a photodiode, and a first portion of a control circuitry region. One or more of the semiconductor processing tools 102-116 may form a circuitry die. One or more of the semiconductor processing tools 102-116 may bond the sensor die and the circuitry at an interface region. One or more of the semiconductor processing tools 102-116 may form the circuitry die to include a second portion of the control circuitry region associated with the pixel sensor. The second portion of the control circuitry region includes a row select transistor of the pixel sensor.

As another example, the one or more of the semiconductor processing tools 102-116 may form, in a sensor die, a photodiode in a sensing region of a pixel sensor included in a pixel array. One or more of the semiconductor processing tools 102-116 may form a transfer transistor, included in a first portion of a control circuitry region of the sensor die, electrically connected with the photodiode. One or more of the semiconductor processing tools 102-116 may form a first portion of a source follower transistor, included in the first portion of the control circuitry region, electrically connected with the transfer transistor. One or more of the semiconductor processing tools 102-116 may form a row select transistor, included in the first portion of the control circuitry region, electrically connected with the transfer transistor. One or more of the semiconductor processing tools 102-116 may form, in a circuitry die, a second portion of the source follower transistor included in a second portion of the control circuitry region associated with the pixel sensor bonding the sensor die and the circuitry die.

As another example, one or more of the semiconductor processing tools 102-116 may form an image sensor device to include a sensor die. One or more of the semiconductor processing tools 102-116 may form the sensor die to include a pixel sensor. One or more of the semiconductor processing tools 102-116 may form the pixel sensor to include a sensing region that includes a photodiode, and a first portion of a control circuitry region including a first portion of a source follower transistor of the pixel sensor. One or more of the semiconductor processing tools 102-116 may form the image sensor device to include a circuitry die. One or more of the semiconductor processing tools 102-116 may bond the sensor die and the circuitry die at an interface region. One or more of the semiconductor processing tools 102-116 may form the circuitry die to include a second portion of the control circuitry region associated with the pixel sensor. One or more of the semiconductor processing tools 102-116 may form the second portion of the control circuitry region to include a row select transistor of the pixel sensor and a second portion of the source follower transistor of the pixel sensor.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
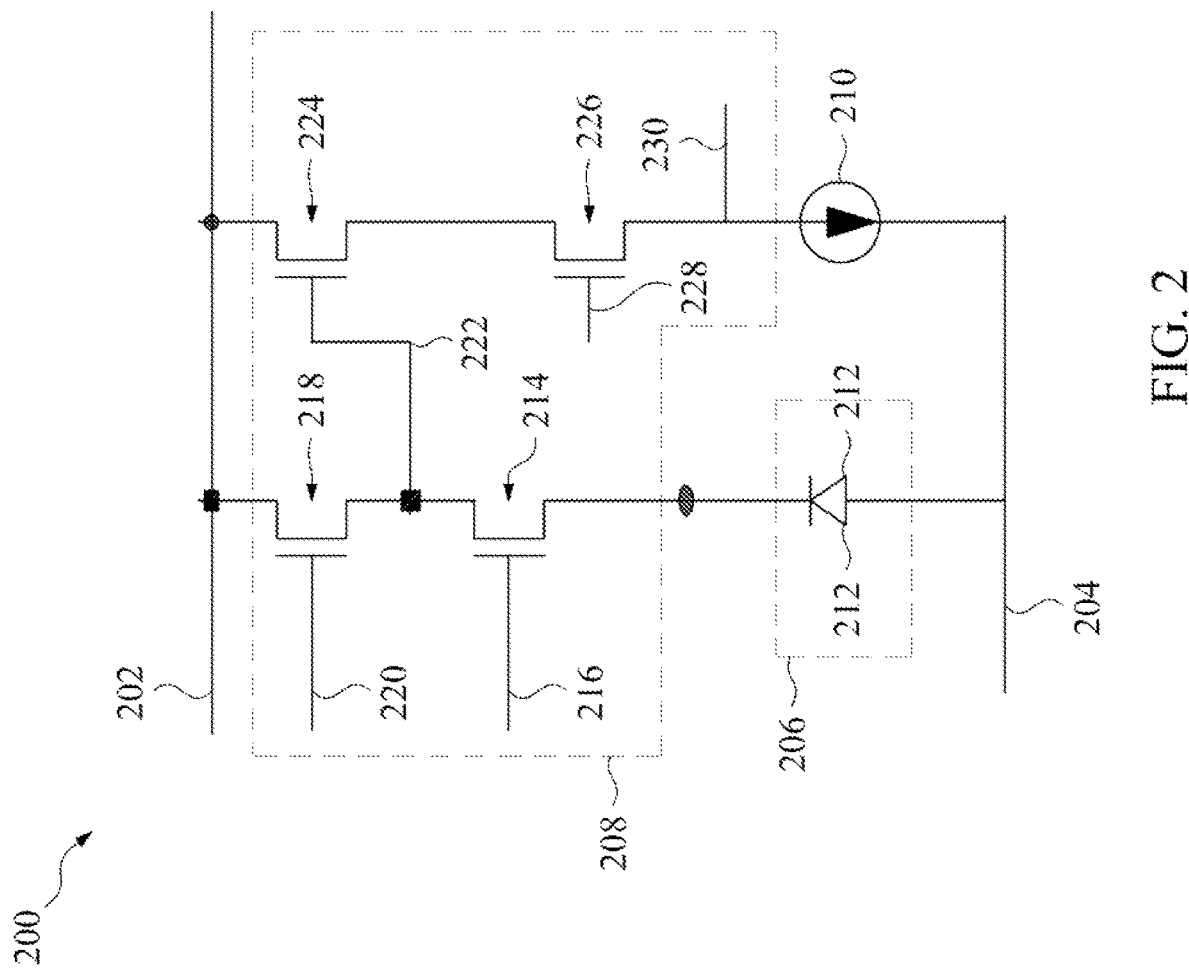
FIG. 2 is a diagram of an example of a pixel sensor described herein.

FIG. 2 is a diagram of an example of a pixel sensor 200 described herein. The pixel sensor 200 may include a front side pixel sensor (e.g., a pixel sensor that is configured to receive photons of light from a front side of a sensor die), a back side pixel sensor (e.g., a pixel sensor that is configured to receive photons of light from a back side of a sensor die), and/or another type of pixel sensor. The pixel sensor 200 may be electrically connected to a supply voltage ($V_{dd}$) 202 and an electrical ground 204.

The pixel sensor 200 includes a sensing region 206 that may be configured to sense and/or accumulate incident light (e.g., light directed toward the pixel sensor 200). The pixel sensor 200 also includes a control circuitry region 208. The control circuitry region 208 is electrically connected with the sensing region 206 and is configured to receive a photocurrent 210 that is generated by the sensing region 206. Moreover, the control circuitry region 208 is configured to transfer the photocurrent 210 from the sensing region 206 to downstream circuits such as amplifiers or analog-to-digital (AD) converters, among other examples.

The sensing region 206 includes a photodiode 212. The photodiode 212 may absorb and accumulate photons of the incident light, and may generate the photocurrent 210 based on absorbed photons. The magnitude of the photocurrent 210 is based on the amount of light collected in the photodiode 212. Thus, the accumulation of photons in the photodiode 212 generates a build-up of electrical charge that represents the intensity or brightness of the incident light (e.g., a greater amount of charge may correspond to a greater intensity or brightness, and a lower amount of charge may correspond to a lower intensity or brightness).

The photodiode 212 is electrically connected with a source of a transfer transistor 214 in the control circuitry region 208. The transfer transistor 214 is configured to control the discharge of the photocurrent 210 from the photodiode 212. The photocurrent 210 is provided from the source of the transfer transistor 214 to a drain of the transfer transistor 214 based on selectively switching a gate of the transfer transistor 214. The gate of the transfer transistor 214 may be selectively switched by applying a transfer voltage ($V_{tx}$) 216 to the gate of the transfer transistor 214. In some implementations, the transfer voltage 216 being applied to the gate of the transfer transistor 214 causes a conductive channel to form between the source and the drain of the transfer transistor 214, which enables the photocurrent 210 to traverse along the conductive channel from the source to the drain. In some implementations, the transfer voltage 216 being removed from the gate (or the absence of the transfer voltage 216) causes the conductive channel to be removed such that the photocurrent 210 cannot pass from the source to the drain.

The control circuitry region 208 further includes a reset transistor 218. The reset transistor 218 is electrically connected to the supply voltage 202 and to the drain of the transfer transistor 214. The reset transistor 218 is configured to pull the drain of the transfer transistor 214 to a high voltage (e.g., to the supply voltage 202) to "reset" the control circuitry region 208 prior to activation of the transfer transistor 214 to read the photocurrent 210 from the photodiode 212. The reset transistor 218 may be controlled by a reset voltage ($V_{rst}$) 220.

The output from the drain of the transfer transistor 214 is electrically connected by a floating diffusion node 222 with a gate of a source follower transistor 224. The output from the transfer transistor 214 is provided to the gate of the source follower transistor 224 by the floating diffusion node 222, which applies a floating diffusion voltage ($V_{fd}$) to the gate of the source follower transistor 224. This permits the photocurrent 210 to be observed without removing or discharging the photocurrent 210 from the floating diffusion node 222. The reset transistor 218 is instead used to remove or discharge the photocurrent 210 from the floating diffusion node 222.

The source follower transistor 224 functions as a high impedance amplifier for the pixel sensor 200. The source follower transistor 224 provides a voltage to current conversion of the floating diffusion voltage. The output of the source follower transistor 224 is electrically connected with a row select transistor 226, which is configured to control the flow of the photocurrent 210 to external circuitry. The row select transistor 226 is controlled by selectively applying a select voltage ($V_{di}$) 228 to the gate of the row select transistor 226. This permits the photocurrent 210 to flow to an output 230 of the pixel sensor 200.

As described herein, one or more transistors of the control circuitry region 208 of the pixel sensor 200 may be included in separate dies of a stacked image sensor device such as a 3D CMOS image sensor (3DCIS). In particular, the row select transistor 226 and/or the source follower transistor 224 may be included in a different die from the photodiode 212, the transfer transistor 214 and the reset transistor 218 to provide a greater amount of space or area for the photodiode 212. This enables the size of the photodiode 212 to be increased to increase the sensitivity and/or overall performance of the light sensing performance of the pixel sensor, and/or enables the size of the pixel sensor 200 to be decreased while maintaining the same size for the photodiode 212.

As indicated above, FIG. 2 is provided as an example. Other examples may differ from what is described with regard to FIG. 2.

Figure 3A:
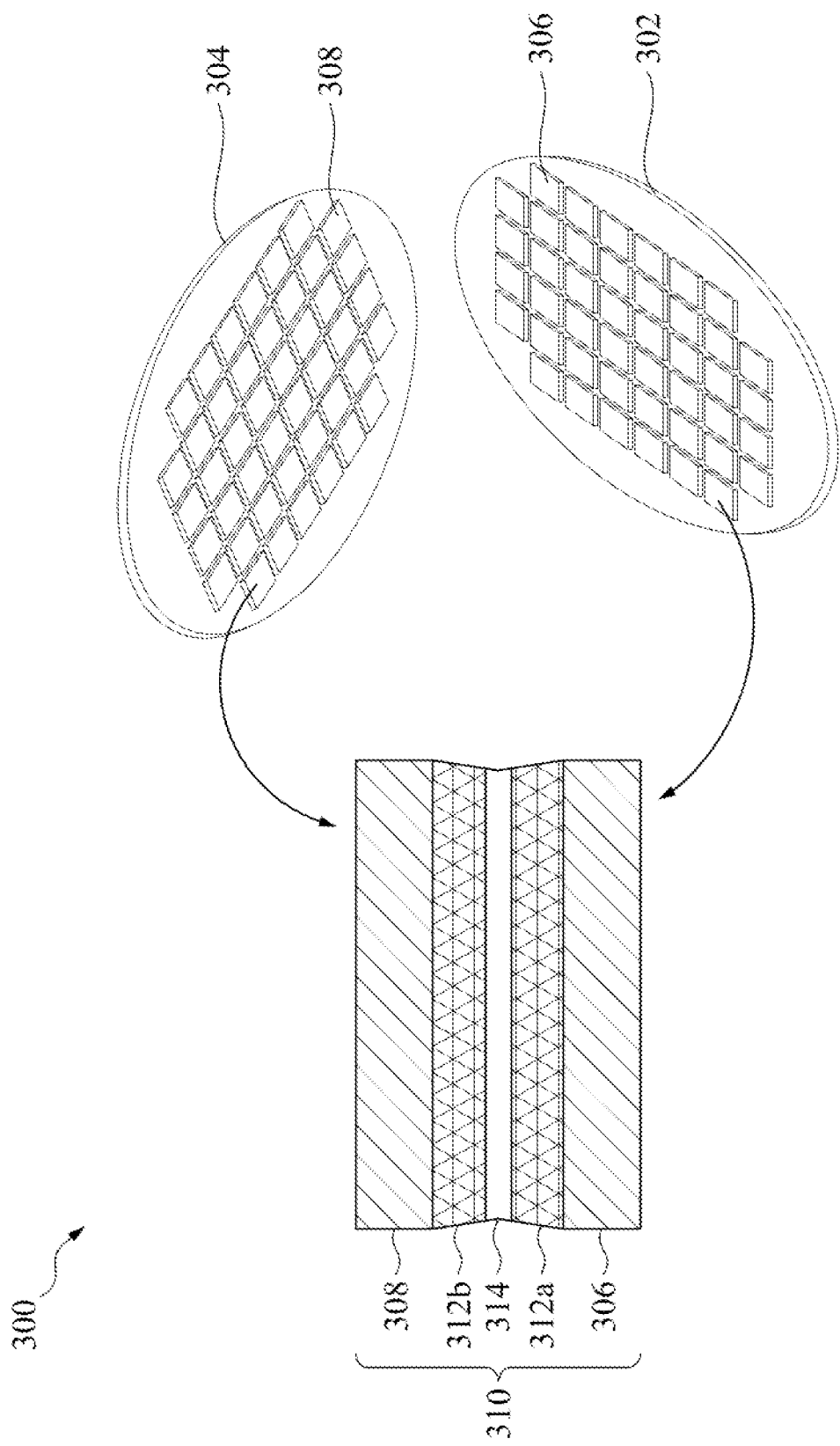
FIGS. 3A-4B are diagrams of examples of a stacked image sensor device described herein.
Figure 3B:
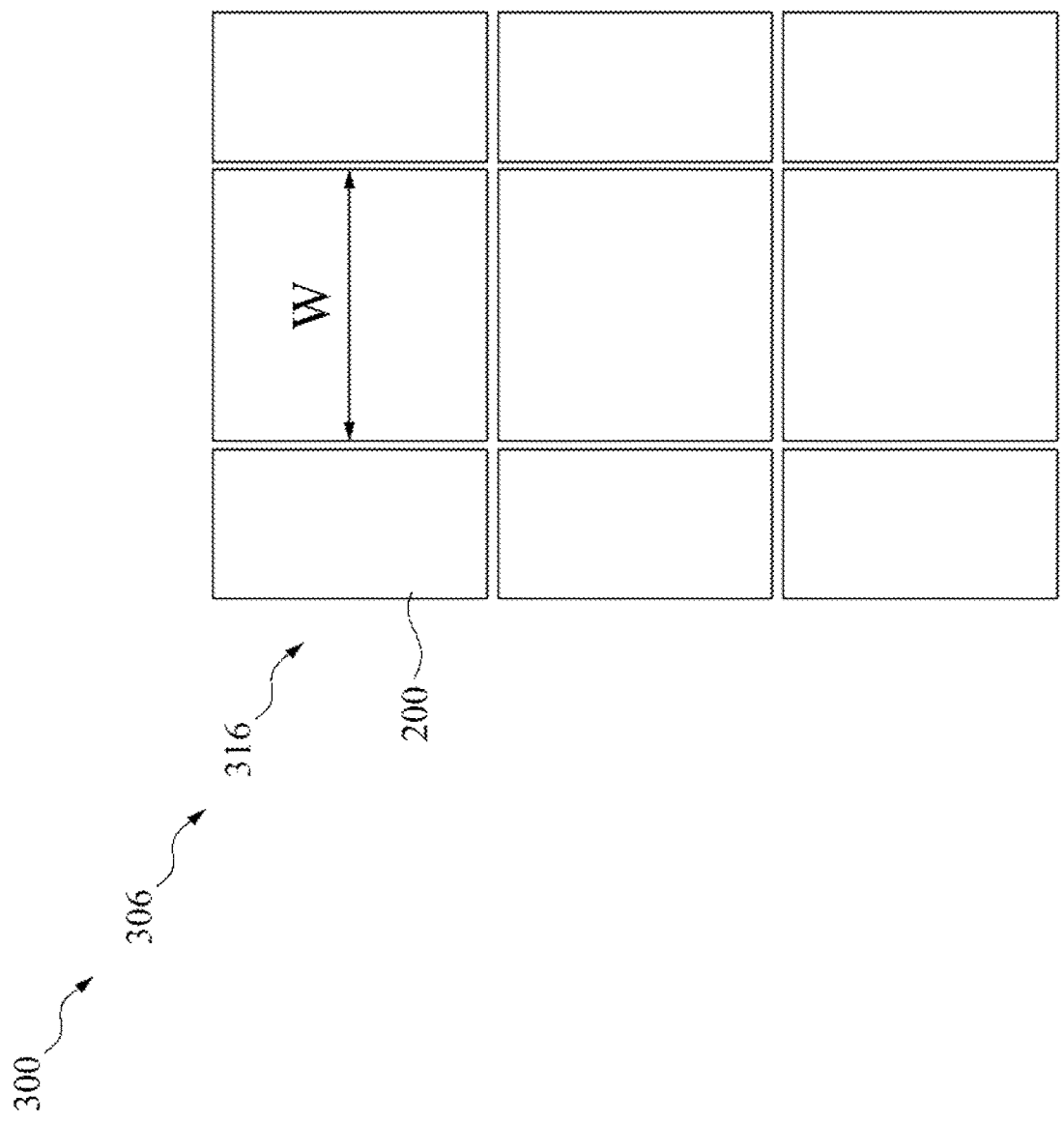

FIGS. 3A and 3B are diagrams of examples 300 of a stacked image sensor device described herein. As shown in FIG. 3A, the stacked image sensor device may be formed by bonding a sensor wafer 302 and a circuitry wafer 304. For example, the bonding tool 116 may perform a bonding operation to bond the sensor wafer 302 and the circuitry wafer 304 using a hybrid bonding technique, a direct bonding technique, an eutectic bonding technique, and/or another bonding technique. In the bonding operation, sensor dies 306 on the sensor wafer 302 are bonded with associated circuitry dies 308 on the circuitry wafer 304 to form stacked image sensor devices 310. The image sensor devices 310 are then diced and packaged. Other processing steps may be performed to form the image sensor devices 310.

Each image sensor device 310 includes a sensor die 306 and a circuitry die 308. The sensor die 306 includes a pixel array that includes a plurality of pixel sensors 200, or portions of a plurality of pixel sensors 200. In particular, the pixel array includes at least the sensing regions 206 (and thus, the photodiodes 212) of the pixel sensors 200. Accordingly, the sensor die 306 primarily is configured to sense photons of incident light and convert the photons to a photocurrent 210.

The circuitry die 308 includes circuitry that is configured to measure, manipulate, and/or otherwise use the photocurrent 210. Moreover, the circuitry die 308 includes at least a subset of the transistors of the circuitry regions 208 of the pixel sensors 200. For example, the circuitry die 308 may include the row select transistors 226 of the pixel sensors 200, the source follower transistors 224 of the pixel sensor, and/or a combination thereof. This provides increased area on the sensor die 306 for the photodiodes 212, which enables the size of the photodiodes 212 to be increased to increase the sensitivity and/or overall performance of the light sensing performance of the pixel sensor 200, and/or enables the size of the pixel sensors 200 to be decreased while maintaining the same size for the photodiodes 212.

As further shown in FIG. 3A, the sensor die 306 may include a back end of line (BEOL) region 312a and the circuitry die 308 may include a BEOL region 312b. The BEOL region 312a and the BEOL region 312b may each include one or more metallization layers that are insulated by one or more dielectric layers. The BEOL region 312a and the BEOL region 312b may electrically connect the sensor die 306 and the circuitry die 308, and may electrically connect one or more components of the sensor die 306 and the circuitry die 308 to packaging and/or other structures, among other examples. The sensor die 306 and the circuitry die 308 may be bonded at a bonding region 314, which may be included between the BEOL region 312a and the BEOL region 312b or may be included in a portion of the BEOL region 312a and/or a portion of the BEOL region 312b.

FIG. 3B is a diagram of an example pixel array 316 included on a sensor die 306. FIG. 3B illustrates a top-down view of the pixel array 316. The pixel array 316 may be included on a sensor die 306 of an image sensor device 310. As shown in FIG. 3B, the pixel array 316 may include a plurality of pixel sensors 200 (or portions of the plurality of pixel sensors 200). As further shown in FIG. 3B, the pixel sensors 200 may be arranged in a grid. In some implementations, the pixel sensors 200 are square-shaped (as shown in the example in FIG. 3B). In some implementations, the pixel sensors 200 include other shapes such as rectangle shapes, circle shapes, octagon shapes, diamond shapes, and/or other shapes.

In some implementations, the size of the pixel sensors 200 (e.g., the width or the diameter) of the pixel sensors 200 is approximately 1 micron. In some implementations, the size of the pixel sensors 200 (e.g., the width or the diameter) of the pixel sensors 200 is less than approximately 1 micron. For example, a width (W) of one or more of the pixel sensors 200 may be included in a range of approximately 0.6 microns to approximately 0.7 microns. In these examples, the pixel sensors 200 may be referred to as sub-micron pixel sensors. Sub-micron pixel sensors may decrease the pixel sensor pitch (e.g., the distance between adjacent pixel sensors) in the pixel array 316, which may enable increased pixel sensor density in the pixel array 316 (which can increase the performance of the pixel array 316). However, other values for the range of the size of the pixel sensors 200 are within the scope of the present disclosure.

As indicated above, FIGS. 3A and 3B are provided as examples. Other examples may differ from what is described with regard to FIGS. 3A and 3B.

Figure 4A:
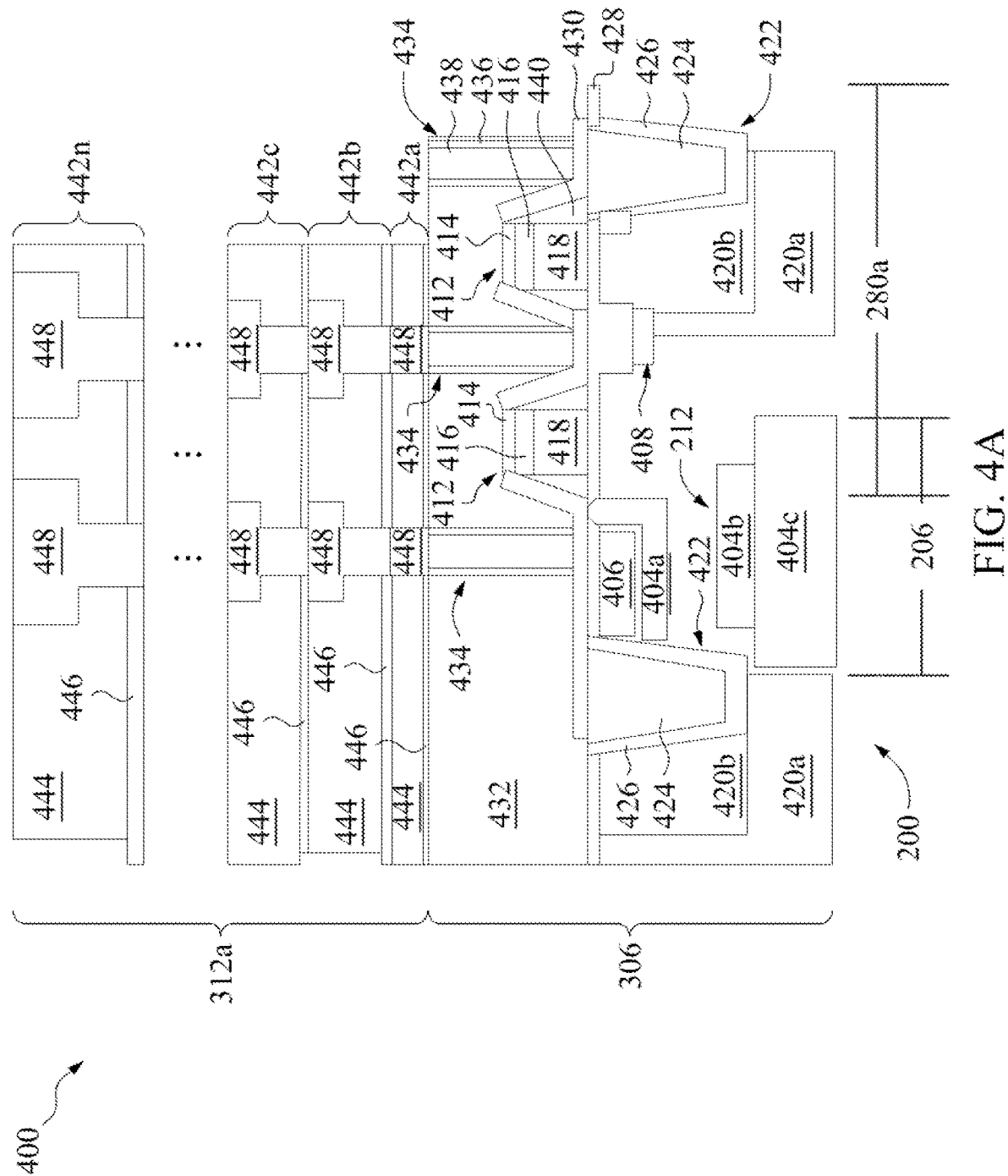
Figure 4B:
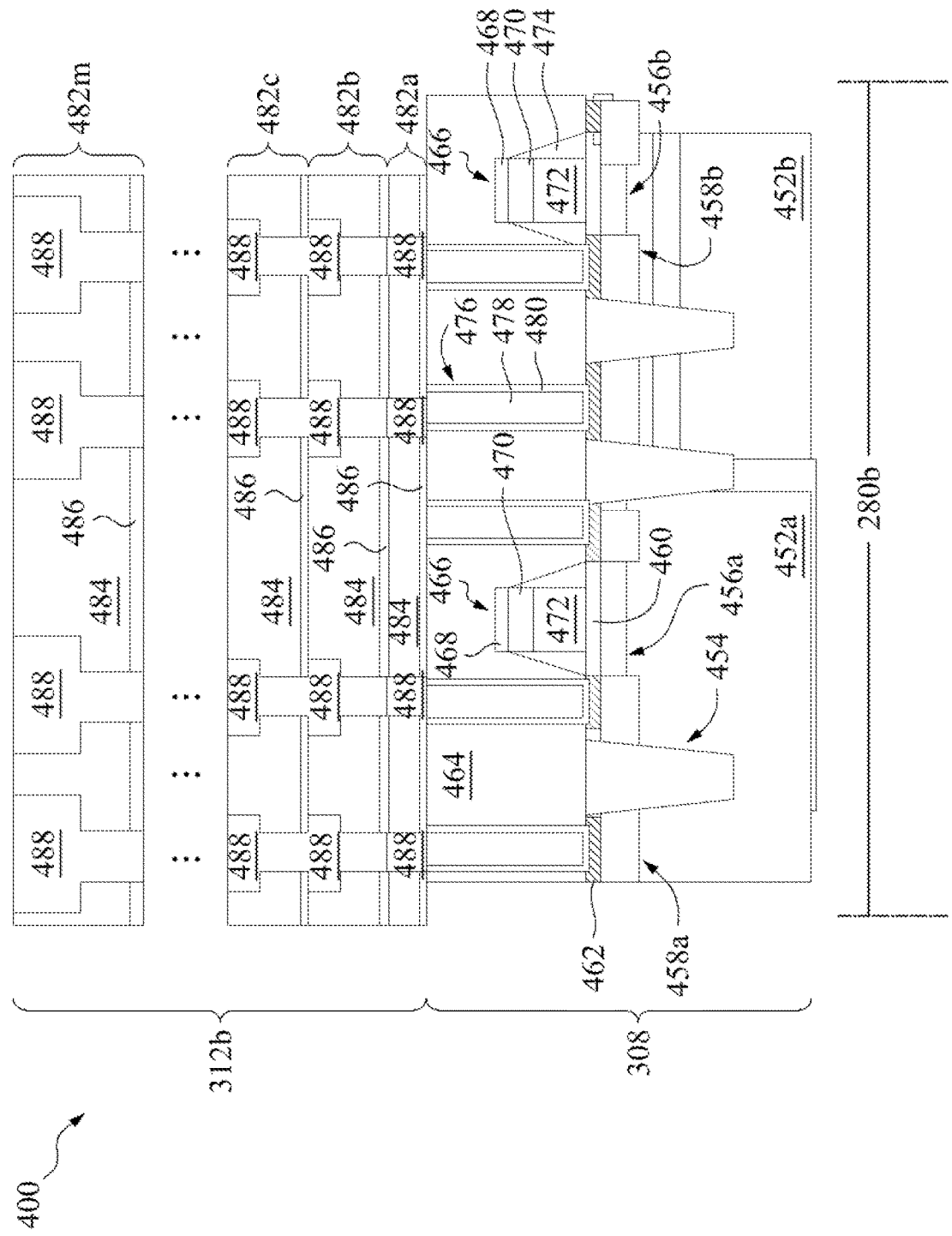

FIGS. 4A and 4B are diagrams of examples 400 of a plurality of portions of a stacked image sensor device 310. In particular, FIG. 4A illustrates a cross-section of an example of a portion of a sensor die 306 and an associated BEOL region 312a, and FIG. 4B illustrates a cross-section of an example of a portion of a circuitry die 308 and an associated BEOL region 312b. The sensor die 306 and the circuitry die 308 may be bonded to form the stacked image sensor device 310, as described herein.

As shown in FIG. 4A, the pixel sensor 200 may include a substrate 402. The substrate 402 may include a semiconductor die substrate, a semiconductor wafer, a stacked semiconductor wafer, or another type of substrate in which semiconductor pixels may be formed. In some implementations, the substrate 402 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 402 is formed of a doped material (e.g., a p-doped material or an n-doped material) such as a doped silicon.

The pixel sensor 200 may include a photodiode 212 that is included in the substrate 402. The photodiode 212 may be included in the sensing region 206 of the pixel sensor 200. The photodiode 212 may include a plurality of regions that are doped with various types of ions to form a p-n junction or a PIN junction (e.g., a junction between a p-type portion, an intrinsic (or undoped) type portion, and an n-type portion). For example, the substrate 402 may be doped with an n-type dopant to form one or more n-type regions 404a-404c of the photodiode 212, and the substrate 402 may be doped with a p-type dopant to form a p-type region 406 of the photodiode 212. The photodiode 212 may be configured to absorb photons of incident light. The absorption of photons causes the photodiode 212 to accumulate a charge (e.g., the photocurrent 210) due to the photoelectric effect. Photons may bombard the photodiode 212, which causes emission of electrons in the photodiode 212.

The regions included in the photodiode 212 may be stacked and/or vertically arranged. For example, the p-type region 406 may be included over the one or more n-type regions 404a-404c. The p-type region 406 may provide noise isolation for the one or more n-type regions 404a-404c and may facilitate photocurrent generation in the photodiode 212. In some implementations, the p-type region 406 (and thus, the photodiode 212) is spaced away (e.g., downward) from a top surface of the substrate 402 to provide noise isolation and/or light-leakage isolation from one or more upper layers of the pixel sensor 200. The gap between the top surface of the substrate 402 and the p-type region 406 may decrease charging of the pixel sensor 200, may decrease the likelihood of plasma damage to the photodiode 212, and/or may reduce the dark current of the pixel sensor 200 and/or the white pixel performance of the pixel sensor 200, among other examples.

The n-type region 404b may be located over and/or on the n-type region 404c, and the n-type region 404a may be located over and/or on the n-type region 404b. The n-type region 404b and the n-type region 404c may be referred to as deep n-type regions or deep n-wells and may extend the n-type regions 404a-404c of the photodiode 212. This may provide an increased area for photon absorption in the photodiode 212. Moreover, at least a subset of the one or more n-type regions 404a-404c may have different doping concentrations. For example, the n-type region 404a may include a greater n-type dopant concentration relative to the n-type region 404b and the n-type region 404c, and the n-type region 404b may include a greater n-type dopant concentration relative to the n-type region 404c. As a result, an n-type dopant gradient is formed, which may increase the migration of electrons upward in the photodiode 212.

The pixel sensor 200 may include a drain extension region and a drain region 408 coupled and/or electrically connected to the drain extension region. The drain extension region may be adjacent to the drain region 408. The drain region 408 may include a highly-doped n-type region (e.g., an n$^+$ doped region). The drain extension region may include lightly-doped n-type region(s) that facilitate the transfer of photocurrent from the n-type region 404a to the drain region 408. In some implementations, the drain extension region is spaced away (e.g., downward) from a surface of the substrate 402 to provide noise isolation and/or light-leakage isolation from one or more upper layers of the pixel sensor 200. The gap between the surface of the substrate 402 and the drain extension region may increase noise isolation for the drain extension region, may decrease random noise and/or random telegraph noise in the pixel sensor 200, may decrease the likelihood of plasma damage to the drain extension region, and/or may reduce the dark current of the pixel sensor 200 and/or the white pixel performance of the pixel sensor 200, among other examples.

The pixel sensor 200 may include a plurality of transistors in a first portion 208a of the control circuitry region 208. A transistor 410 may correspond to the transfer transistor 214, which may be configured to control the transfer of the photocurrent 210 between the photodiode 212 and the drain region 408. The gate of the transistor 410 may be energized (e.g., by applying a voltage or a current to the gate) to cause a conductive channel to form between the photodiode 212 and the drain region 408. A transistor 412 may correspond to the reset transistor 218.

The gates of the transistors 410 and 412 may each include a gate electrode stack that includes a salicide 414 (e.g., a self-aligned silicide layer), a doped layer 416, and a gate electrode 418. The gate electrode 418 may be included over a portion of the surface of the substrate 402, the doped layer 416 may be located over and/or on the gate electrode 418, and the salicide 414 may be located over and/or on the doped layer 416. The gate electrode 418 may include a layer of polysilicon (PO), an n$^+$ doped polysilicon, a p$^+$ doped polysilicon, and/or another type of material.

The pixel sensor 200 may include a plurality of regions to provide electrical isolation and/or optical isolation between the pixel sensor 200 and adjacent pixel sensors. The pixel sensor 200 may include a deep p-well region (DPW) 420a adjacent to, and at least partially surrounding, the photodiode 212. In some implementations, the pixel sensor 200 further includes a cell p-well region (CPW) 420b above the deep p-well region 420a. The deep p-well region 420a (and the cell p-well region 420b, if included) may include a circle or ring shape in a top-down view in the substrate 402. The deep p-well region 420a (and the cell p-well region 420b, if included) may each include a p$^+$ doped silicon material or another p$^+$ doped material.

A deep trench isolation (DTI) structure 422 may be included in the substrate 402 adjacent to the photodiode 212 and the drain region 408. Moreover, the DTI structure 422 may be included above and/or partially in the deep p-well region 420a and/or the cell p-well region 420b. In some implementations, the DTI structure 422 may be included in a portion of the cell p-well region 420b. The DTI structure 422 may include one or more trenches that extend downward into the substrate 402, and that are adjacent the photodiode 212 and the drain region 408. In a top-down view of the pixel sensor 200, the DTI structure 422 may surround the photodiode 212 and the drain region 408. In other words, the photodiode 212 and the drain region 408 may be included within a perimeter of the DTI structure 422 of the pixel sensor 200. The DTI structure 422 may provide optical isolation between the pixel sensor 200 and one or more adjacent pixel sensors to reduce the amount of optical crosstalk between the pixel sensor 200 and the one or more adjacent pixel sensors. In particular, the DTI structure 422 may absorb, refract, and/or reflect photons of incident light, which may reduce the amount of incident light that travels through a pixel sensor 200 into an adjacent pixel sensor and is absorbed by the adjacent pixel sensor.

The DTI structure 422 may include an oxide layer 424 and one or more layers 426 between the substrate 402 of the pixel sensor 200 and an oxide layer 424 of the DTI structure 422. The one or more layers 426 may include a passivation layer and a capping layer, among other examples. The passivation layer may include a boron (B) material, an amorphous boron (a-B) material, and/or another material. The capping layer may include a silicon (Si) material, an amorphous silicon (a-Si) material, and/or another material. The passivation layer may be included to further decrease optical crosstalk by providing a boron-silicon interface between the passivation layer and the substrate 402. The boron-silicon interface resists, reduces, and/or minimizes penetration and/or diffusion of photons into the oxide layer 424. The capping layer may be included to protect the passivation layer from damage during one or more semiconductor processing operations for forming the pixel sensor 200.

The oxide layer 424 may function to reflect incident light toward the photodiode 212 to increase the quantum efficiency of the pixel sensor 200 and to reduce optical crosstalk between the pixel sensor 200 and one or more adjacent pixel sensors. In some implementations, the oxide layer 424 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 424.

A dielectric layer 428 may be included above and/or over the surface of the substrate 402. The gate electrodes 418 may be included over and/or on the dielectric layer 428. The dielectric layer 428 may include a dielectric material such as tetraethyl orthosilicate (TEOS) or another type of dielectric material. A sidewall oxide layer 430 may be included over and/or on the dielectric layer 428 on the surface of the substrate 402. The sidewall oxide layer 430 may also be included over sidewalls of the gates of the transistors 410 and 412. The sidewall oxide layer 430 may include an oxide such as silicon oxide ($SiO_x$) or another type of oxide material.

An interlayer dielectric (ILD) layer 432 may be included over and/or on the dielectric layer 428. The ILD layer 432 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material. The ILD layer 432 surrounds and/or encapsulates the gates of the transistors 410 and 412. Interconnects 434 may be formed to one or more source/drain regions of the transistors 410 and/or 412. The ILD layer 432 surrounds and/or encapsulates the interconnects 434. The interconnects 434, may include a liner 436 and a conductive layer 438 that includes one or more conductive materials, such as tungsten (W), cobalt (Co), ruthenium (Ru), copper (Cu), and/or another type of conductive material. Spacers 440 may be included on sidewalls of the gates of the transistors 410 and 412 to electrically isolate the gates from the interconnects 434. The spacers may include a silicon nitride ($Si_xN_y$) and/or another dielectric material.

One or more BEOL layers 442a-442n may be included over and/or on the ILD layer 432. The BEOL layers 442a-442n may be included in the BEOL region 312a of the sensor die 306. Each BEOL layer may include a dielectric layer 444 and a contact etch stop layer (CESL) 446. Moreover, one or more of the BEOL layers 442a-442n may include metallization layers 448 that electrically connect to one or more of the interconnects 434 and/or to upper and/or lower BEOL layers.

As shown in FIG. 4B, the circuitry die 308 may include a second portion 208b of the control circuitry region 208 of the pixel sensor 200. The circuitry die 308 may include a substrate 450. The substrate 450 may include a semiconductor die substrate, a semiconductor wafer, a stacked semiconductor wafer, or another type of substrate in which semiconductor pixels may be formed. In some implementations, the substrate 450 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 450 is formed of a doped material (e.g., a p-doped material or an n-doped material) such as a doped silicon.

A p-well region (e.g., a region of p-doped substrate) 452a and an adjacent n-well region (e.g., a region of n-doped substrate) 452b are included in the substrate 450. One or more DTI structures 454 are included in the substrate 450, the p-well region 452a, and/or the n-well region 452b. A high threshold voltage (HVT) n-well (HVTN) 456a may be formed in the p-well region 452a, and a HVT p-well (HVTP) 456b may be formed in the n-well region 452b. N-type regions 458a may be included in the p-well region 452a, and may function as source/drain regions in the p-well region 452a. P-type regions 458b may be included in the n-well region 452b, and may function as source/drain regions in the n-well region 452b.

A dielectric layer 460 may be included over and/or on the n-type regions 458a and/or the p-type regions 458b. A salicide 462 may be included over and/or on the dielectric layer 460. An ILD layer 464 may be included over and/or on the salicide 462.

As further shown in FIG. 4B, one or more transistors 466 may be included in the second portion 208b of the control circuitry region 208 of the pixel sensor 200. Thus, one or more transistors of the pixel sensor 200 are located on the circuitry die 308 as opposed to being located on the sensor die 306. This enables the sensing region 206 on the sensor die 306 to occupy a greater area of the sensor die 306 than if the entire control circuitry region 208 were included on the sensor die 306. The transistor(s) 466 may include, for example, the source follower transistor 224 (or a portion thereof), the row select transistor 226, and/or another transistor in the control circuitry region 208 of the pixel sensor 200.

The gates of the transistor(s) 466 may each include a gate electrode stack that includes a salicide 468, a doped layer 470 (or a p-doped layer), and a gate electrode 472. The gate electrode 472 may be included over a portion of the surface of the substrate 450, the doped layer 470 may be located over and/or on the gate electrode 472, and the salicide 468 may be located over and/or on the doped layer 470. The gates of the transistors 466 may be insulated by spacers 474.

Interconnects 476 may be formed to one or more source/drain regions of the transistors 466. The ILD layer 464 surrounds and/or encapsulates the interconnects 476. The interconnects 476 may include a conductive layer 478, a liner 480, and/or another layer. One or more BEOL layers 482a-482m may be included over and/or on the ILD layer 464. The BEOL layers 482a-482m may be included in the BEOL region 312b of the circuitry die 308. Each BEOL layer may include a dielectric layer 484 and a CESL 486. Moreover, one or more of the BEOL layers 482a-482m may include metallization layers 488 that electrically connect to one or more of the interconnects 476 and/or to upper and/or lower BEOL layers.

As indicated above, FIGS. 4A and 4B are provided as examples. Other examples may differ from what is described with regard to FIGS. 4A and 4B.

Figure 5E:
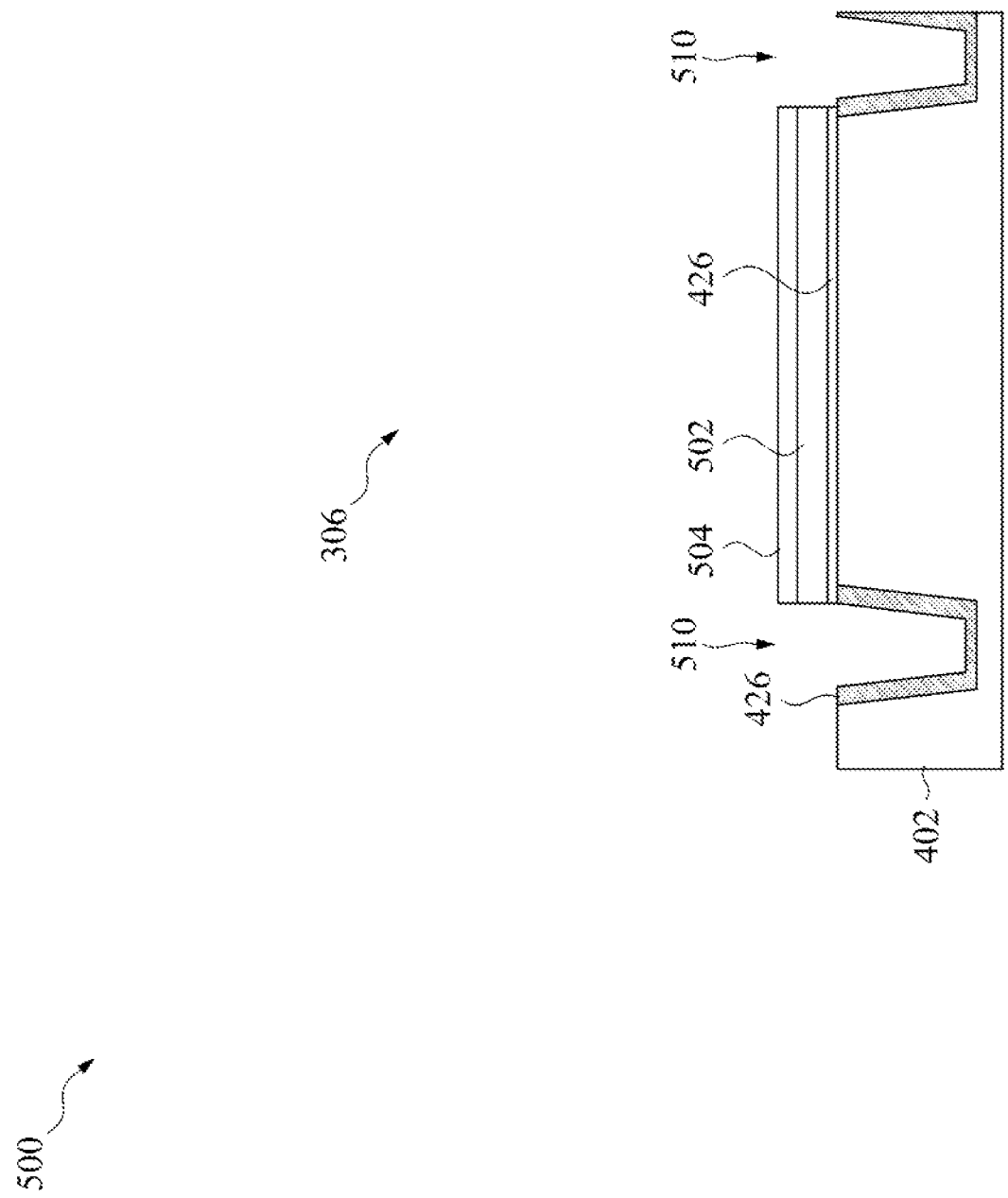
FIGS. 5A-5X are diagrams of an example implementation described herein.
Figure 5I:
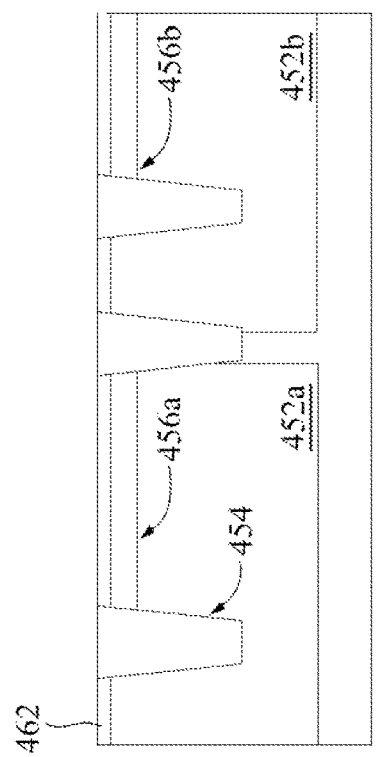
Figure 5H:
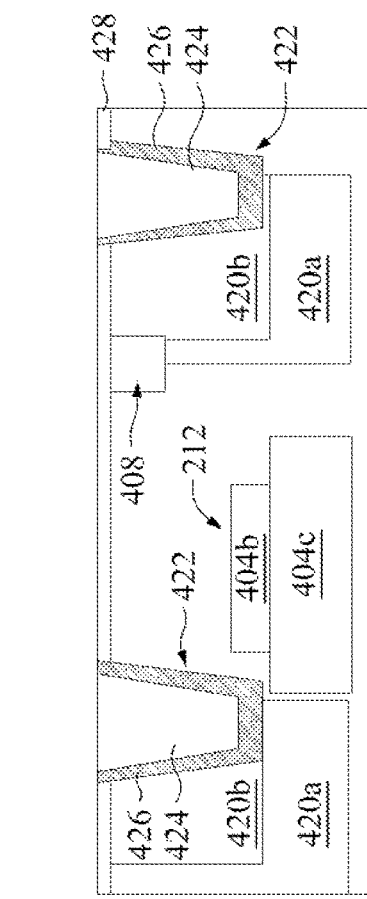
Figure 5K:
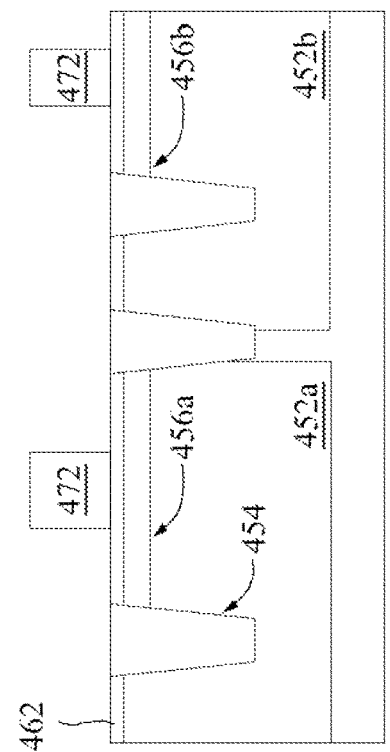
Figure 5J:
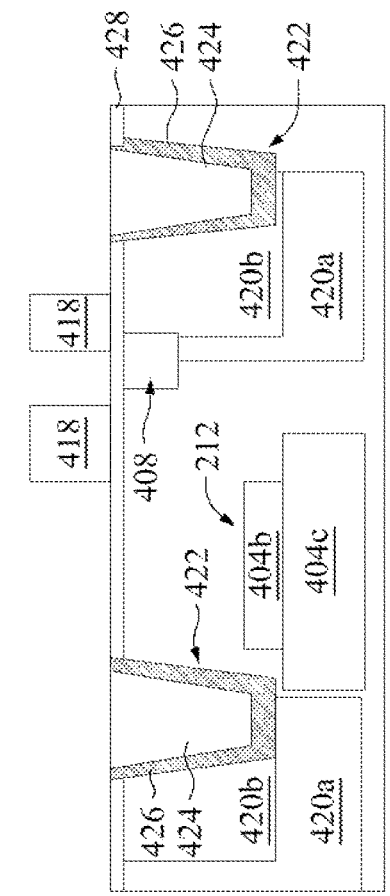
Figure 5L:
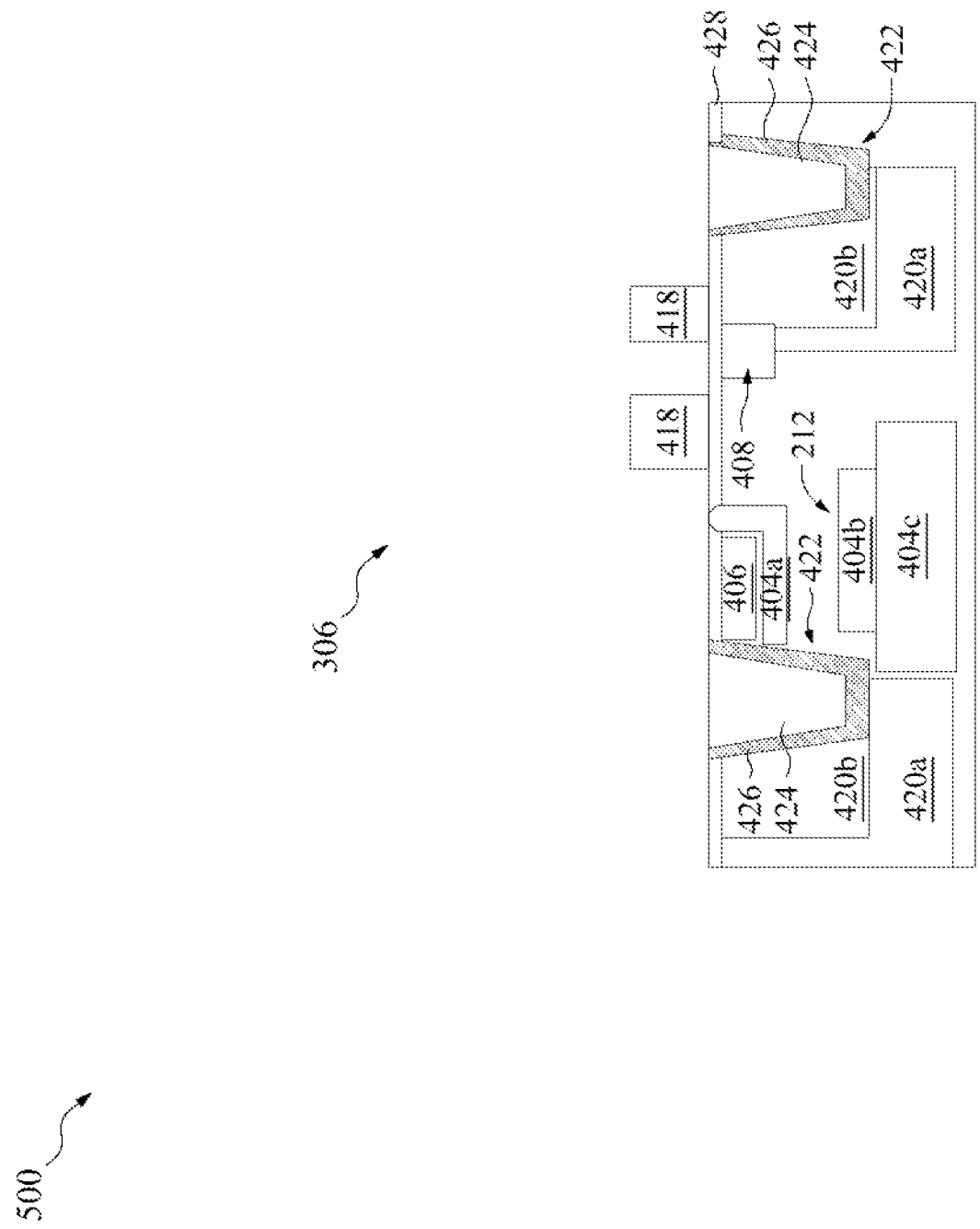
Figure 5P:
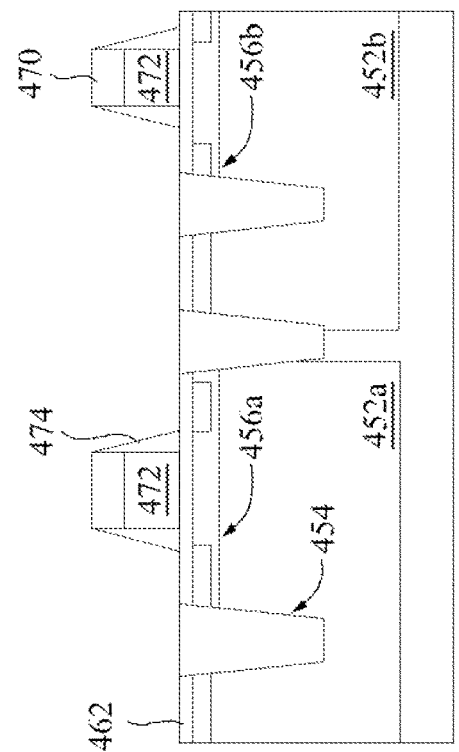
Figure 5O:
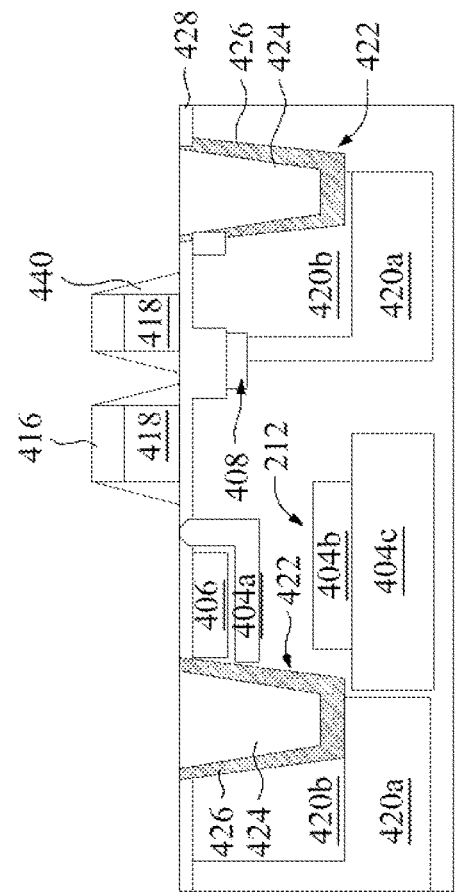
Figure 5Q:
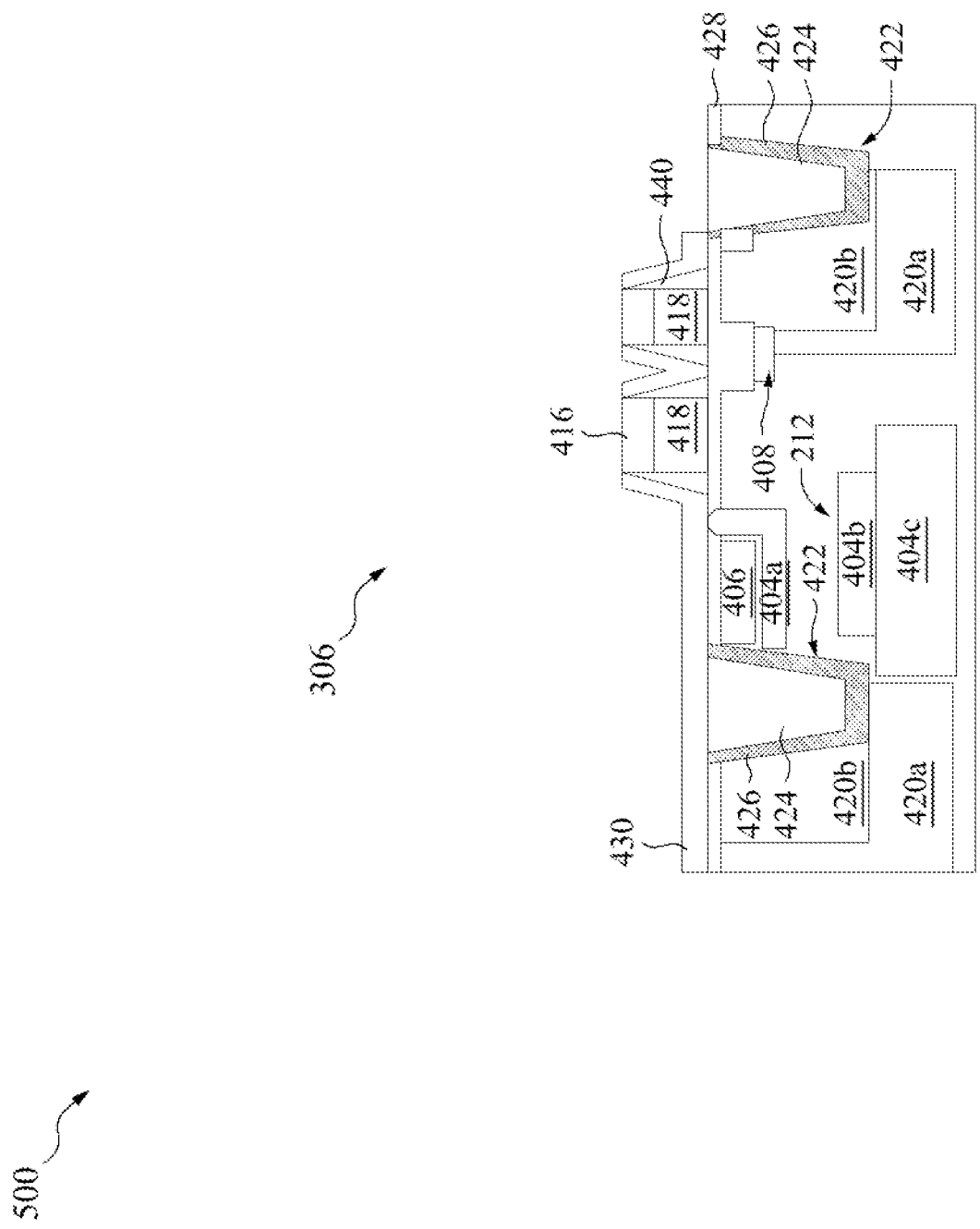
Figure 5V:
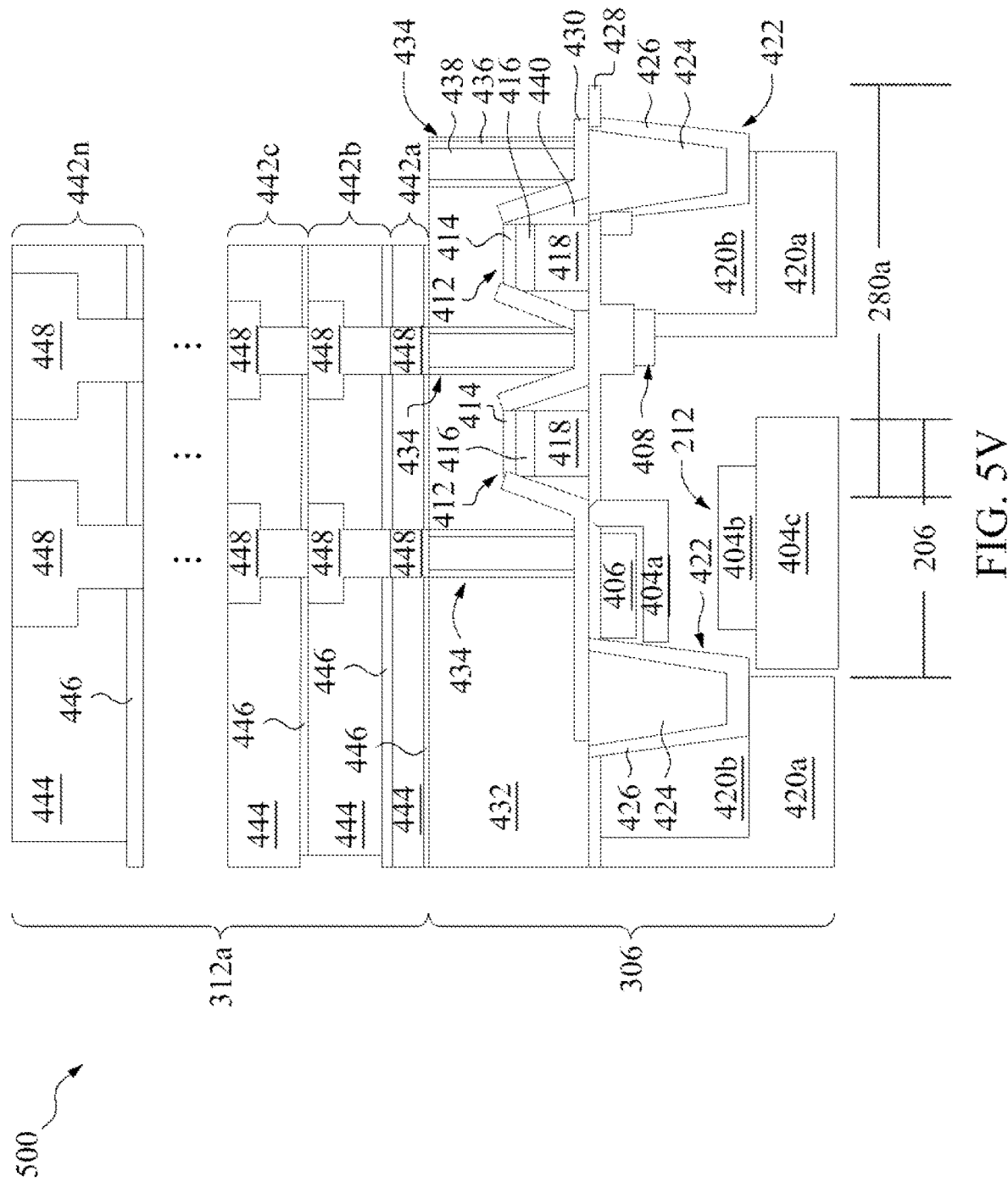
Figure 5W:
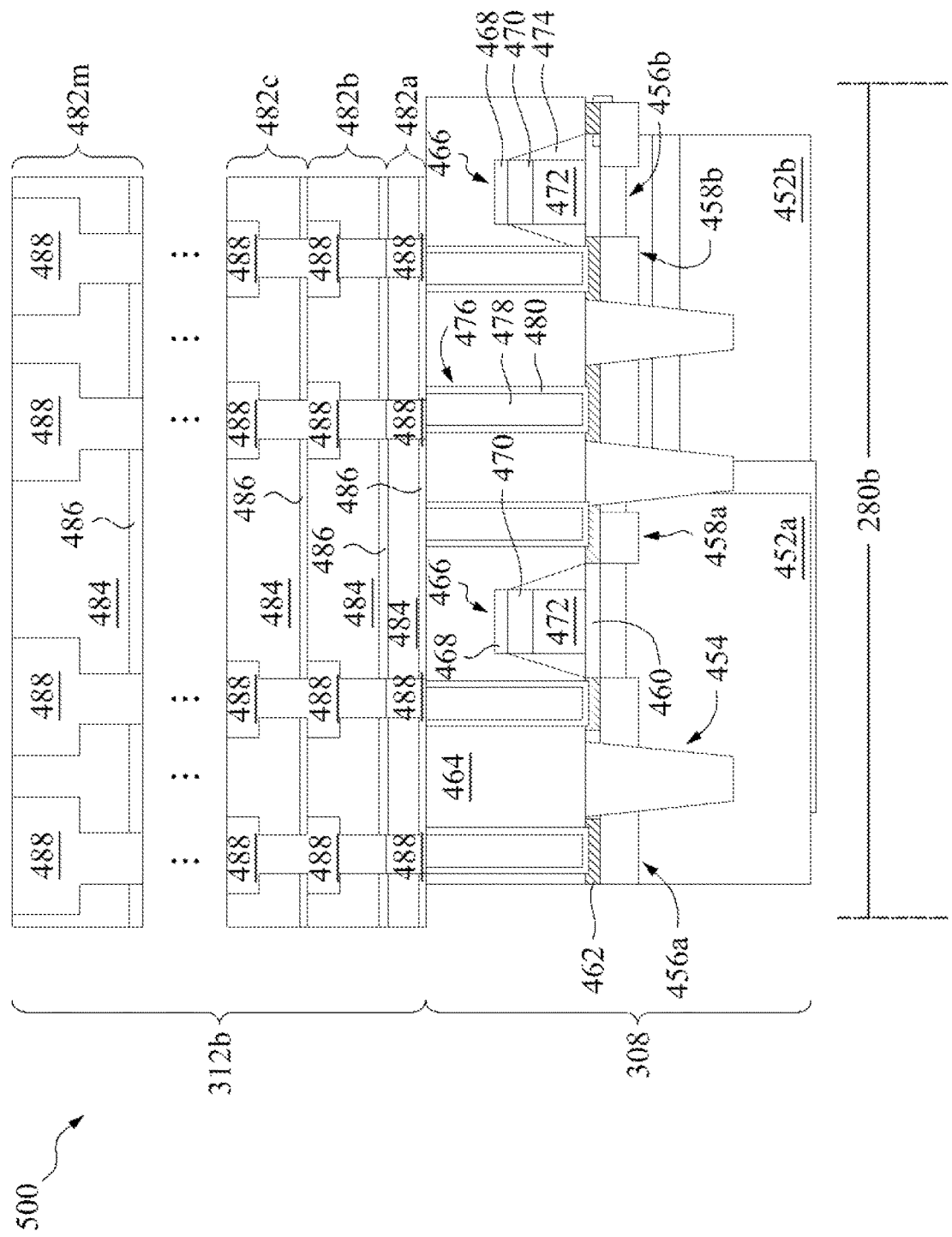
Figure 5X:
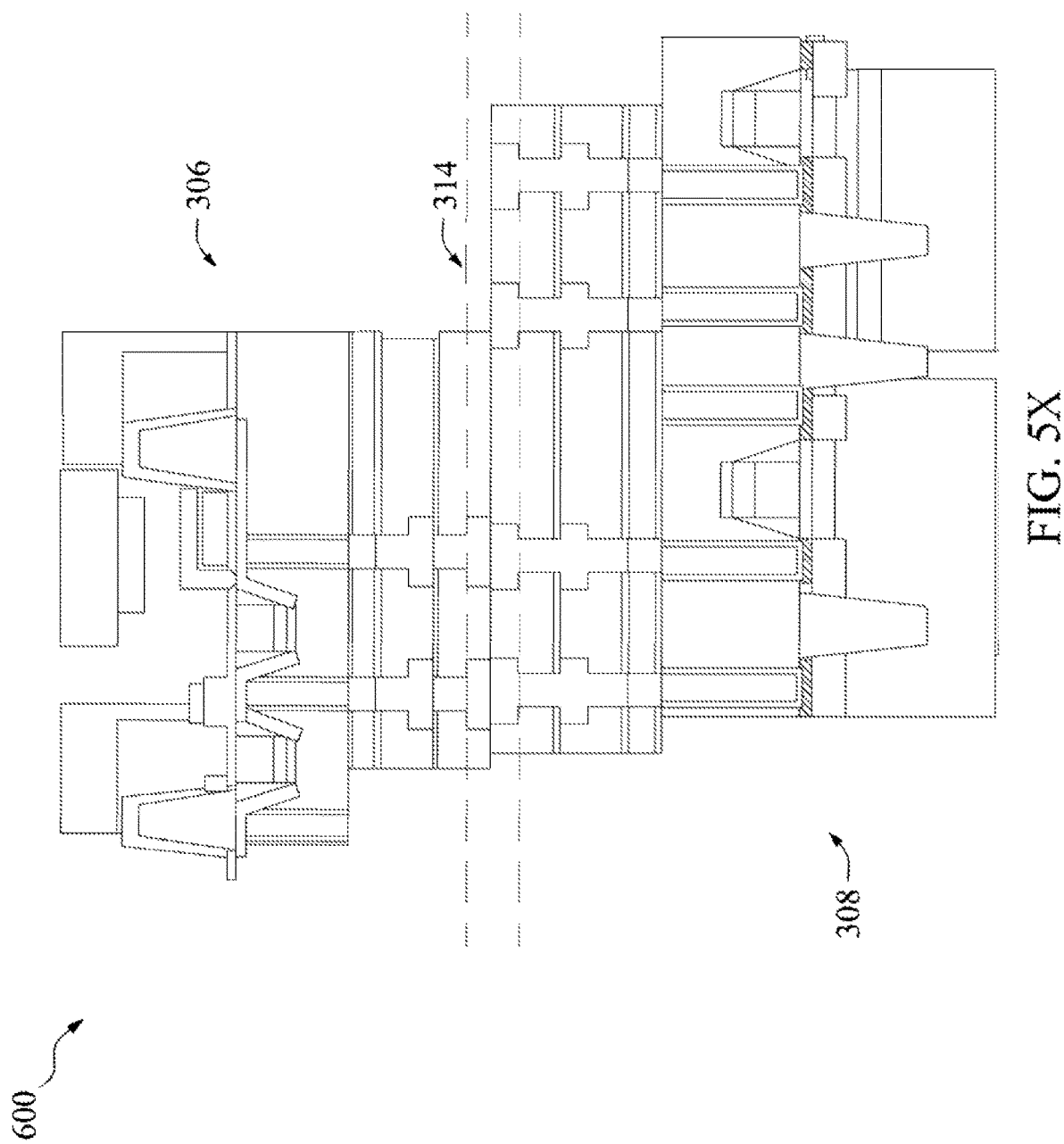

FIGS. 5A-5X are diagrams of an example implementation 500 described herein. Example implementation 500 may be an example process for forming a portion of an image sensor device 310 described herein, such as forming a portion of a sensor die 306 and a portion of a circuitry die 308, and bonding the sensor die 306 and the circuitry die 308 to form the image sensor device 310. Moreover, the example implementation 500 may be an example process of forming one or more transistors of a control circuitry region 208, of a pixel sensor 200 included in the image sensor device 310, on the circuitry die 308 to provide a greater area for a photodiode 212 of the pixel sensor 200.

As shown in FIG. 5A, the deposition tool 102 may form one or more layers on the substrate 402 of the sensor die 306. The one or more layers may include the dielectric layer 428 and one or more masking layers 502 and 504. In some implementations, the deposition tool 102 forms a greater quantity of masking layers. The deposition tool 102 may perform one or more deposition operations to form the one or more layers, which may include an ALD operation, a CVD operation, an epitaxial operation, a PVD operation, and/or another type of deposition operation.

As shown in FIG. 5B, the deposition tool 102 may form one or more layers on the substrate 450 of the circuitry die 308. The one or more layers may include the dielectric layer 460 and one or more masking layers 506 and 508. In some implementations, the deposition tool 102 forms a greater quantity of masking layers. The deposition tool 102 may perform one or more deposition operations to form the one or more layers, which may include an ALD operation, a CVD operation, an epitaxial operation, a PVD operation, and/or another type of deposition operation.

As shown in FIG. 5C, the substrate 402 may be etched to form a trench 510 (or another type of recess) in the substrate 402 of the sensor die 306. The deposition tool 102 may form a photoresist layer on the one or more masking layers, the exposure tool 104 may expose the photoresist layer to a radiation source to pattern the photoresist layer, the developer tool 106 may develop and remove portions of the photoresist layer to expose the pattern, and the etch tool 108 may etch portions of the one or more masking layers to form a pattern in the one or more masking layers. The etch tool 108 may then etch the substrate 402 to form the trench 510 based on the pattern in the one or more masking layers. In some implementations, a photoresist removal tool removes the remaining portions of the photoresist layer (e.g., using a chemical stripper, a plasma asher, and/or another technique) after the etch tool 108 etches the substrate 402 to form the trench 510.

As shown in FIG. 5D, the substrate 450 may be etched to form a trench 512 (or another type of recess) in the substrate 450 of the circuitry die 308. The deposition tool 102 may form a photoresist layer on the one or more masking layers, the exposure tool 104 may expose the photoresist layer to a radiation source to pattern the photoresist layer, the developer tool 106 may develop and remove portions of the photoresist layer to expose the pattern, and the etch tool 108 may etch portions of the one or more masking layers to form a pattern in the one or more masking layers. The etch tool 108 may then etch the substrate 450 to form the trench 512 based on the pattern in the one or more masking layers. In some implementations, a photoresist removal tool removes the remaining portions of the photoresist layer (e.g., using a chemical stripper, a plasma asher, and/or another technique) after the etch tool 108 etches the substrate 450 to form the trench 512.

As shown in FIG. 5E, the trench 510 may be lined with the one or more layers 426. The deposition tool 102 may form the one or more layers 426 by conformal deposition such that the one or more layers 426 are formed as thin films that conform to the shape and/or profile of the sidewalls and bottom surface of the trench 510. The deposition tool 102 may perform one or more deposition operations to form the one or more layers 426 in the trench 510, which may include an ALD operation, a CVD operation, an epitaxial operation, a PVD operation, and/or another type of deposition operation. In some implementations, the deposition tool 102 and the etch tool 108 may respectively perform a plurality of cyclical deposition and etch operations to form the one or more layers 426. In these implementations the deposition tool 102 deposits a portion of the one or more layers 426, the etch tool 108 etches the portion of the one or more layers 426, and this cyclical process continues until the one or more layers 426 are formed to a particular thickness and/or profile or shape.

As shown in FIG. 5F, the trench 510 may be filled with an oxide material to form the oxide layer 424 of the DTI structure 422 in the sensor die 306. The deposition tool 102 may form the oxide layer 424 over and/or on the one or more layers 426. The deposition tool 102 may perform one or more deposition operations to form the oxide layer 424 in the trench 510, which may include an ALD operation, a CVD operation, an epitaxial operation, a PVD operation, and/or another type of deposition operation. The planarization tool 110 may perform a planarization operation to planarize the oxide layer 424 after the oxide layer 424 is deposited in the trench 510 such that a top surface of the oxide layer 424 is approximately a same height as the dielectric layer 428. In some implementations, the one or more masking layers are removed during the planarization operation.

In some implementations, a wet cleaning operation may be performed (e.g., by the deposition tool 102 and/or another type of semiconductor processing tool) after formation of the one or more layers 426 and prior to formation of the oxide layer 424 in the trench 510. The wet cleaning operation may be performed to clean the trench 510 prior to filling the trench with the oxide material of the oxide layer 424 to reduce the likelihood of defect formation in the DTI structure 422.

As shown in FIG. 5G, the trench 512 may be filled with an oxide material to form the DTI structure 454 in the circuitry die 308. The deposition tool 102 may perform one or more deposition operations to form the DTI structure 454, which may include an ALD operation, a CVD operation, an epitaxial operation, a PVD operation, and/or another type of deposition operation. The planarization tool 110 may perform a planarization operation to planarize the DTI structure 454 after formation of the DTI structure 454 such that a top surface of the DTI structure 454 is approximately a same height as the ILD layer 464. In some implementations, the one or more masking layers are removed during the planarization operation.

In some implementations, a wet cleaning operation may be performed (e.g., by the deposition tool 102 and/or another type of semiconductor processing tool) prior to formation of the DTI structure 454 in the trench 512. The wet cleaning operation may be performed to clean the trench 512 prior to filling the trench with the oxide material of the DTI structure 454 to reduce the likelihood of defect formation in the DTI structure 454.

As shown in FIG. 5H, the implantation tool 114 may perform one or more implantation operations to dope one or more portions of the substrate 402 of the sensor die 306. For example, the ion implantation tool 114 may dope the substrate 402 with p-type ions to form the deep p-well region 420a in the substrate 402. As another example, the ion implantation tool 114 may dope a portion of the substrate 402 above the deep p-well region 420a with p-type ions to form the cell p-well region 420b above and/or over the deep p-well region 420a. As another example, the ion implantation tool 114 may dope a plurality of regions of the substrate 402 as a part of forming the photodiode 212. The ion implantation tool 114 may dope the substrate 402 with n-type ions to form the one or more n-type regions 404b and 404c. As another example, the ion implantation tool 114 may dope the substrate 402 with n-type ions to form the drain region 408. In some implementations, at least a subset of these regions are doped with different concentrations of ions. In some implementations, at least a subset of these regions are doped with the same concentration of ions.

As shown in FIG. 5I, the implantation tool 114 may perform one or more implantation operations to dope one or more portions of the substrate 450 of the circuitry die 308. For example, the ion implantation tool 114 may dope the substrate 450 with p-type ions to form the p-well region 452a in the substrate 450. As another example, the ion implantation tool 114 may dope a portion of the substrate 450 with n-type ions to form the n-well region 452b. As another example, the ion implantation tool 114 may dope a portion of the substrate 450 with n-type ions to form the HVTN region 456a. As another example, the ion implantation tool 114 may dope a portion of the substrate 450 with p-type ions to form the HVTP region 456b. In some implementations, at least a subset of these regions are doped with different concentrations of ions. In some implementations, at least a subset of these regions are doped with the same concentration of ions.

As shown in FIG. 5J, the gate electrodes 418 may be formed over and/or on the dielectric layer 428 of the sensor die 306. The gate electrodes 418 may be formed for a transfer transistor 214 and a reset transistor 218 of the first portion 208a of the control circuitry region 208 of the pixel sensor 200. In some implementations, additional gate electrodes 418 may be formed for a source follower transistor 224 (or for a portion of a source follower transistor 224) and/or for a row select transistor 226. The deposition tool 102 may deposit the polysilicon material of the gate electrodes 418. The deposition tool 102 may perform one or more deposition operations to form the gate electrodes 418, which may include an ALD operation, a CVD operation, an epitaxial operation, a PVD operation, and/or another type of deposition operation. In some implementations, one or more of the semiconductor processing tools 102-116 use a self-aligned double patterning (SADP) technique and/or another type of multiple patterning technique to form a plurality of patterns that are used to deposit the gate electrodes 418. In some implementations, an EUV lithography technique is used to form the pattern that is used to form the gate electrodes 418.

As shown in FIG. 5K, the gate electrodes 472 may be formed over and/or on the dielectric layer 460 of the circuitry die 308. The gate electrodes 472 may be formed for a source follower transistor 224 (or a portion of a source follower transistor 224) and/or a row select transistor 226 of the second portion 208b of the control circuitry region 208 of the pixel sensor 200. In this way, at least a portion of the control circuitry region 208 is formed on the circuitry die 308, which provides an increased area for the photodiode 212 on the sensor die 306. The deposition tool 102 may deposit the polysilicon material of the gate electrodes 472. The deposition tool 102 may perform one or more deposition operations to form the gate electrodes 472, which may include an ALD operation, a CVD operation, an epitaxial operation, a PVD operation, and/or another type of deposition operation. In some implementations, one or more of the semiconductor processing tools 102-116 use an SADP technique and/or another type of multiple patterning technique to form a plurality of patterns that are used to deposit the gate electrodes 472. In some implementations, an EUV lithography technique is used to form the pattern that is used to form the gate electrodes 472.

As shown in FIG. 5L, the implantation tool 114 may perform one or more implantation operations to dope one or more portions of the substrate 402 of the sensor die 306. For example, the ion implantation tool 114 may dope the substrate 402 with n-type ions to form the n-type region 404a. As another example, the ion implantation tool 114 may dope the substrate 402 with p-type ions to form the p-type region 406. In some implementations, at least a subset of these regions are doped with different concentrations of ions. In some implementations, at least a subset of these regions are doped with the same concentration of ions.

As shown in FIG. 5M, the deposition tool 102 may form the spacers 440 on the sidewalls of the gate electrodes 418 of the sensor die 306. The deposition tool 102 may perform one or more deposition operations to form the spacers 440, which may include an ALD operation, a CVD operation, an epitaxial operation, a PVD operation, and/or another type of deposition operation. In some implementations, the deposition tool 102 performs a deposition operation to deposit the material of the spacers 440, and the etch tool 108 removes portions of the material such that the remining portions correspond to the spacers 440.

As shown in FIG. 5N, the deposition tool 102 may form the spacers 474 on the sidewalls of the gate electrodes 472 of the circuitry die 308. The deposition tool 102 may perform one or more deposition operations to form the spacers 474, which may include an ALD operation, a CVD operation, an epitaxial operation, a PVD operation, and/or another type of deposition operation. In some implementations, the deposition tool 102 performs a deposition operation to deposit the material of the spacers 474, and the etch tool 108 removes portions of the material such that the remaining portions correspond to the spacers 474.

As shown in FIG. 5O, the ion implantation tool 114 dopes portions of the gate electrodes 418 to form the doped layers 416. For example, the ion implantation tool 114 may dope the gate electrodes 418 with n-type ions to form the doped layers 416. In some implementations, the ion implantation tool 114 dopes additional portions of the substrate 402 to form one or more source/drain regions of the transistors included in the first portion 208a of the circuitry region on the sensor die 306.

As shown in FIG. 5P, the ion implantation tool 114 dopes portions of the gate electrodes 472 to form the doped layers 470. For example, the ion implantation tool 114 may dope one or more of the gate electrodes 472 with n-type ions to form the doped layers 470. As another example, the ion implantation tool 114 may dope one or more of the gate electrodes 472 with p-type ions to form the doped layers 470. In some implementations, the ion implantation tool 114 dopes a first subset of the gate electrodes 472 with p-type ions (e.g., the gate electrodes 472 over the p-well region 452a) and a second subset of the gate electrodes 472 with n-type ions (e.g., the gate electrodes 472 over the n-well region 452b). In some implementations, the ion implantation tool 114 dopes additional portions of the substrate 450 to form the n-type regions 458a in the p-well region 452a, and to form the p-type regions 458b in the n-well region 452b. In some implementations, at least a subset of these regions are doped with different concentrations of ions. In some implementations, at least a subset of these regions are doped with the same concentration of ions.

As shown in FIG. 5Q, the deposition tool 102 may form the sidewall oxide layer 430 over and/or on the dielectric layer 428 and over and/or on the spacers 440 on the sensor die 306. The deposition tool 102 may perform one or more deposition operations to form the sidewall oxide layer 430, which may include an ALD operation, a CVD operation, an epitaxial operation, a PVD operation, and/or another type of deposition operation. In some implementations, the deposition tool 102 performs a deposition operation to deposit the material of the sidewall oxide layer 430, and the etch tool 108 removes portions of the material such that the remining portions correspond to the sidewall oxide layer 430.

As shown in FIG. 5R, the deposition tool 102 may form the salicide 414 over and/or on the doped layer 416 on the sensor die 306. In some implementations, the deposition tool 102 additionally forms the salicide 414 over and/or on one or more portions of the dielectric layer 428. The deposition tool 102 may perform one or more deposition operations to form the salicide 414, which may include an ALD operation, a CVD operation, an epitaxial operation, a PVD operation, and/or another type of deposition operation. In some implementations, the deposition tool 102 performs a deposition operation to deposit the material of the salicide 414, and the etch tool 108 removes portions of the material such that the remining portions correspond to the salicide 414. In some implementations, an annealing operation is performed to increase the material quality of the salicide 414 and/or to remove defects from the salicide 414.

As shown in FIG. 5S, the deposition tool 102 may form the salicide 468 over and/or on the doped layer 470 on the circuitry die 308. The deposition tool 102 may additionally form the salicide 468 over and/or on one or more portions of the dielectric layer 460. The deposition tool 102 may perform one or more deposition operations to form the salicide 462 and the salicide 468, which may include an ALD operation, a CVD operation, an epitaxial operation, a PVD operation, and/or another type of deposition operation. In some implementations, the deposition tool 102 performs a deposition operation to deposit the material of the salicide 462 and the salicide 468, and the etch tool 108 removes portions of the material such that the remining portions correspond to the salicide 462 and the salicide 468. In some implementations, an annealing operation is performed to increase the material quality of the salicide 462 and the salicide 468 and/or to remove defects from the salicide 462 and the salicide 468.

As shown in FIG. 5T, the deposition tool 102 may form the ILD layer 432 over and/or on the dielectric layer 428, over and/or on the sidewall oxide layer 430, and/or over and/or on the salicide 414. The deposition tool 102 may perform one or more deposition operations to form the ILD layer 432, which may include an ALD operation, a CVD operation, an epitaxial operation, a PVD operation, and/or another type of deposition operation.

As further shown in FIG. 5T, the interconnects 434 may be formed in the ILD layer 432. The etch tool 108 may form openings in the ILD layer 432, and the deposition tool 102 may deposit the liner 436 and conductive layer 438 of the interconnects 434 in the openings. The deposition tool 102 may perform one or more deposition operations to form the liner 436 and conductive layer 438, which may include an ALD operation, a CVD operation, an epitaxial operation, a PVD operation, and/or another type of deposition operation, and/or the plating tool 112 may perform a plating operation to form the liner 436 and/or the conductive layer 438. The planarization tool 110 may planarize the interconnects 434 after the interconnects 434 are deposited.

As shown in FIG. 5U, the deposition tool 102 may form the ILD layer 464 over and/or on the dielectric layer 460, over and/or on the spacers 474, over and/or on the salicide 462, and/or over and/or on the salicide 468. The deposition tool 102 may perform one or more deposition operations to form the ILD layer 464, which may include an ALD operation, a CVD operation, an epitaxial operation, a PVD operation, and/or another type of deposition operation.

As further shown in FIG. 5U, the interconnects 476 may be formed in the ILD layer 464. The etch tool 108 may form openings in the ILD layer 464, and the deposition tool 102 may deposit the liner 480 and conductive layer 478 of the interconnects 476 in the openings. The deposition tool 102 may perform one or more deposition operations to form the liner 480 and conductive layer 478, which may include an ALD operation, a CVD operation, an epitaxial operation, a PVD operation, and/or another type of deposition operation, and/or the plating tool 112 may perform a plating operation to form the liner 480 and/or the conductive layer 478. The planarization tool 110 may planarize the interconnects 476 after the interconnects 476 are deposited.

As further shown in FIG. 5V, one or more of the semiconductor processing tools 102-116 may perform one or more operations to form the BEOL region 312a of the sensor die 306. For example, the deposition tool 102 may perform a CVD operation, an ALD operation, a PVD operation, and/or another deposition operation to form the CESLs 446 and the dielectric layers 444. As another example, the deposition tool 102 may perform a CVD operation, an ALD operation, a PVD operation, and/or another deposition operation, and/or the plating tool 112 may perform a plating operation, to form the metallization layers 448. In some implementations, the BEOL layers 442a-442n may be formed in a sequential manner. For example, CESL 446, the dielectric layer 444, and the metallization layers 448 of the BEOL layer 442a may be formed. Then, the CESL 446, the dielectric layer 444, and the metallization layers 448 of the BEOL layer 442b may be formed over and/or on the BEOL layer 442a. The remaining BEOL layers 442c-442n may be formed in a similar sequential manner.

As further shown in FIG. 5W, one or more of the semiconductor processing tools 102-116 may perform one or more operations to form the BEOL region 312b of the circuitry die 308. For example, the deposition tool 102 may perform a CVD operation, an ALD operation, a PVD operation, and/or another deposition operation to form the CESLs 486 and the dielectric layers 484. As another example, the deposition tool 102 may perform a CVD operation, an ALD operation, a PVD operation, and/or another deposition operation, and/or the plating tool 112 may perform a plating operation, to form the metallization layers 488. In some implementations, the BEOL layers 482a-482n may be formed in a sequential manner. For example, CESL 486, the dielectric layer 484, and the metallization layers 488 of the BEOL layer 482a may be formed. Then, the CESL 486, the dielectric layer 484, and the metallization layers 488 of the BEOL layer 482b may be formed over and/or on the BEOL layer 482a. The remaining BEOL layers 482c-482n may be formed in a similar sequential manner.

As shown in FIG. 5X, the bonding tool 116 may perform a bonding operation to bond the sensor die 306 and the circuitry die 308 in a bonding region 314. The bonding tool 116 may use a direct bonding technique, a eutectic bonding technique, a hybrid bonding technique, and/or another type of bonding technique to bond the sensor die 306 and the circuitry die 308. As shown in FIG. 5X, the sensor die 306 and the circuitry die 308 may be orientated such that the BEOL region 312a and the BEOL region 312b are facing. This enables the metallization layers 448 of the BEOL region 312a and the metallization layers 488 of the BEOL region 312b to be electrically connected to electrically connect the sensor die 306 and the circuitry die 308 to form the image sensor device 310.

In some implementations, additional processing operations may be performed to form the image sensor device 310. For example, one or more packaging operations may be performed to package the image sensor device 310. As another example, one or more testing operations may be performed to test the operation of the image sensor device 310.

As indicated above, FIGS. 5A-5X are provided as an example. Other examples may differ from what is described with regard to FIGS. 5A-5X.

Figure 6A:
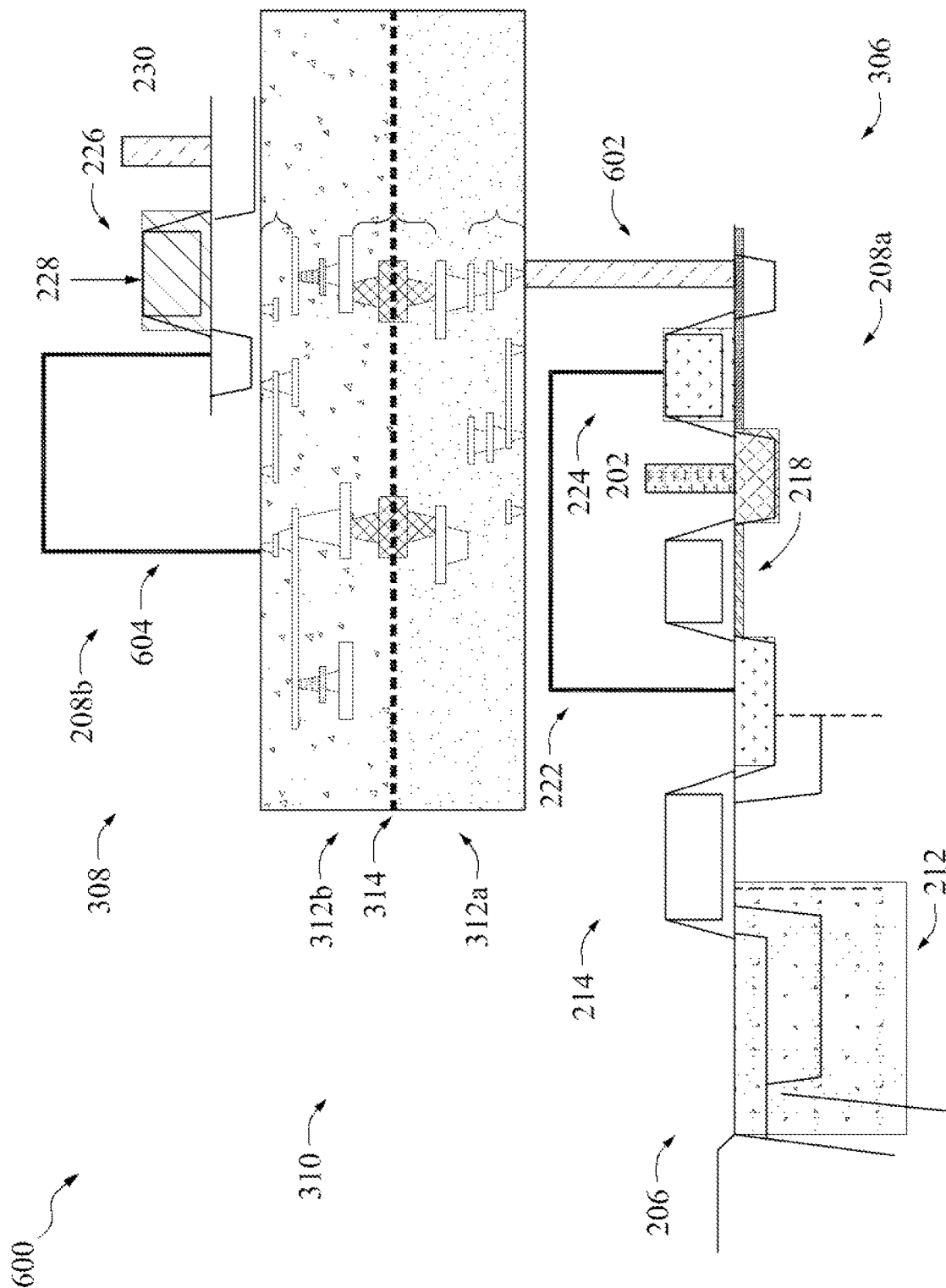
FIGS. 6A, 6B, 7A, 7B, 8A and 8B are diagrams of example configurations for an image sensor device described herein.
Figure 6B:
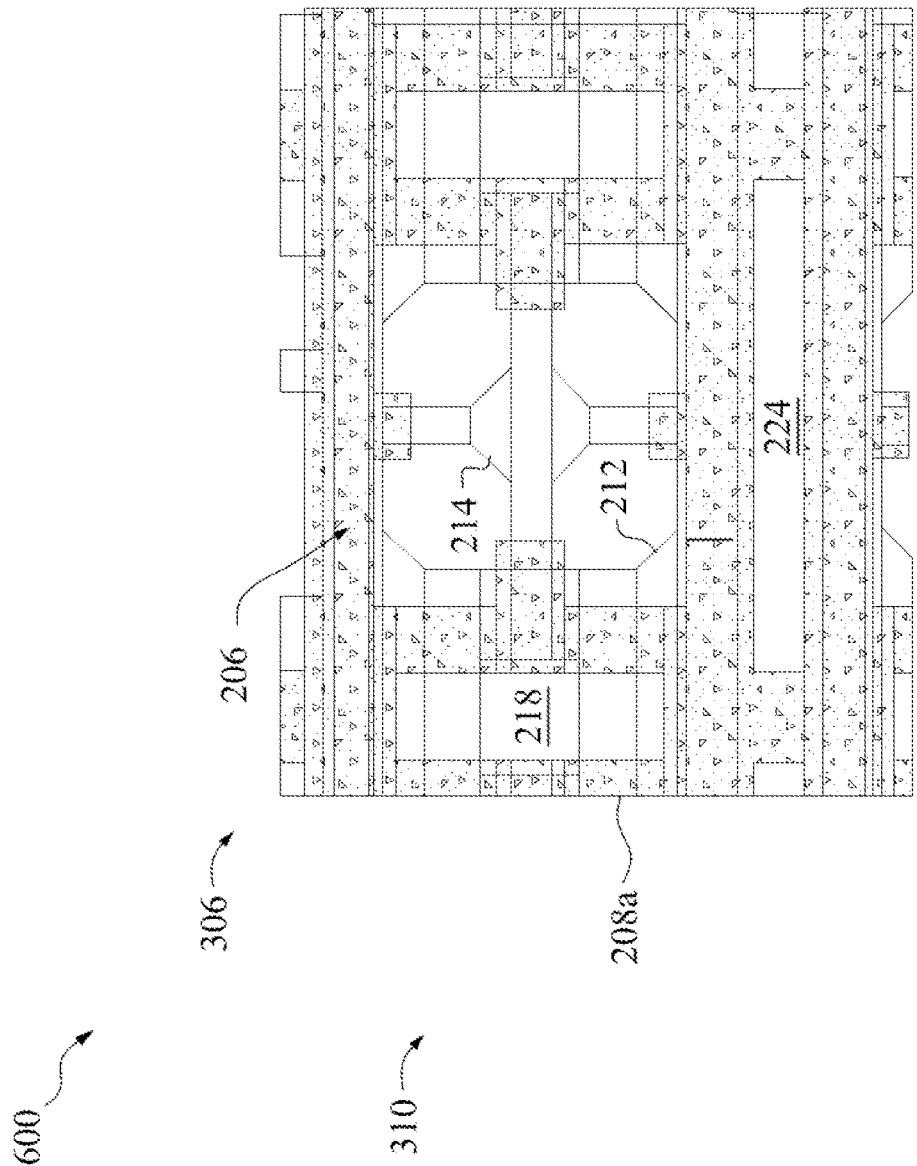

FIGS. 6A and 6B are diagrams of an example configuration 600 for an image sensor device 310 described herein. FIG. 6A is a cross-sectional view of the configuration 600. FIG. 6B is a top-down view of the configuration 600. In the configuration 600, the control circuitry region 208 of one or more pixel sensors 200 of the image sensor device 310 is split between the sensor die 306 of the image sensor device 310 and the circuitry die 308 of the image sensor device 310. In other words, a first portion 208a of the control circuitry region 208 is included on the sensor die 306 and a second portion 208b of the control circuitry region 208 is included on the circuitry die 308. This enables the sensing region 206 on the sensor die 306 to occupy a greater area of the sensor die 306 than if the entire control circuitry region 208 were included on the sensor die 306.

The sensor die 306 and the circuitry die 308 may be stacked in that the sensor die 306 and the circuitry die 308 are bonded at a bonding interface in the bonding region 314 along respective surfaces of the sensor die 306 and the circuitry die 308. Thus, the image sensor device 310 may include a stacked image sensor device such as a 3DCIS. The sensor die 306 and the circuitry die 308 may be electrically connected by a BEOL region 312a of the sensor die 306 and a BEOL region 312b of the circuitry die 308.

As shown in FIG. 6A, the sensor die 306 includes a sensing region 206 of a pixel sensor 200 and a first portion 208a of a control circuitry region 208 of the pixel sensor 200. The sensing region 206 includes a photodiode 212 of the pixel sensor 200. The first portion 208a of the control circuitry region 208 includes transfer transistor 214 that is electrically connected with the photodiode 212. The first portion 208a of the control circuitry region 208 further includes a reset transistor 218. The drain regions of the transfer transistor 214 and the reset transistor 218 are electrically connected with a floating diffusion node 222.

The floating diffusion node 222 is electrically connected with a gate of a source follower transistor 224 in the first portion 208a of the control circuitry region 208 on the sensor die 306. The source region of the source follower transistor 224 is electrically connected with a contact for a supply voltage 202. The drain region of the source follower transistor 224 is electrically connected with an interconnect 602 that electrically connects the source follower transistor 224 to the BEOL region 312a of the sensor die 306.

As further shown in FIG. 6A, the circuitry die 308 includes a second portion 208b of the control circuitry region 208 of the pixel sensor 200. The second portion 208b of the control circuitry region 208 includes a row select transistor 226. The source region of the row select transistor 226 is electrically connected with the BEOL region 312b of the circuitry die 308 by an interconnect 604. Thus, the source region of the row select transistor 226 in the second portion 208b of the control circuitry region 208 on the circuitry die 308, and the drain region of the source follower transistor 224 in the first portion 208a of the control circuitry region 208 on the sensor die 306 are electrically connected through the BEOL region 312a, through the bonding region 314, and through the BEOL region 312b. The gate of the row select transistor 226 is electrically connected with a contact for a select voltage 228. The drain region of the row select transistor 226 is electrically connected with an output contact (e.g., the output 230).

As shown in FIG. 6B, the transfer transistor 214 may be located adjacent to and/or partially over the photodiode 212. The source follower transistor 224 may be located adjacent to a first side of the photodiode 212. The reset transistor 218 may be located adjacent to a second side of the photodiode 212. In some implementations, the first side and the second side are approximately orthogonal. In some implementations, the first side and the second side are opposite sides. In some implementations, the reset transistor 218 and the source follower transistor 224 are located adjacent to the same side of the photodiode 212.

While the example configuration 600 is described in the context of a single pixel sensor 200, the image sensor device 310 may include a plurality of pixel sensors 200 arranged in a pixel array 316, where the pixel sensors 200 include the configuration 600.

As indicated above, FIGS. 6A and 6B are provided as examples. Other examples may differ from what is described with regard to FIGS. 6A and 6B.

Figure 7A:
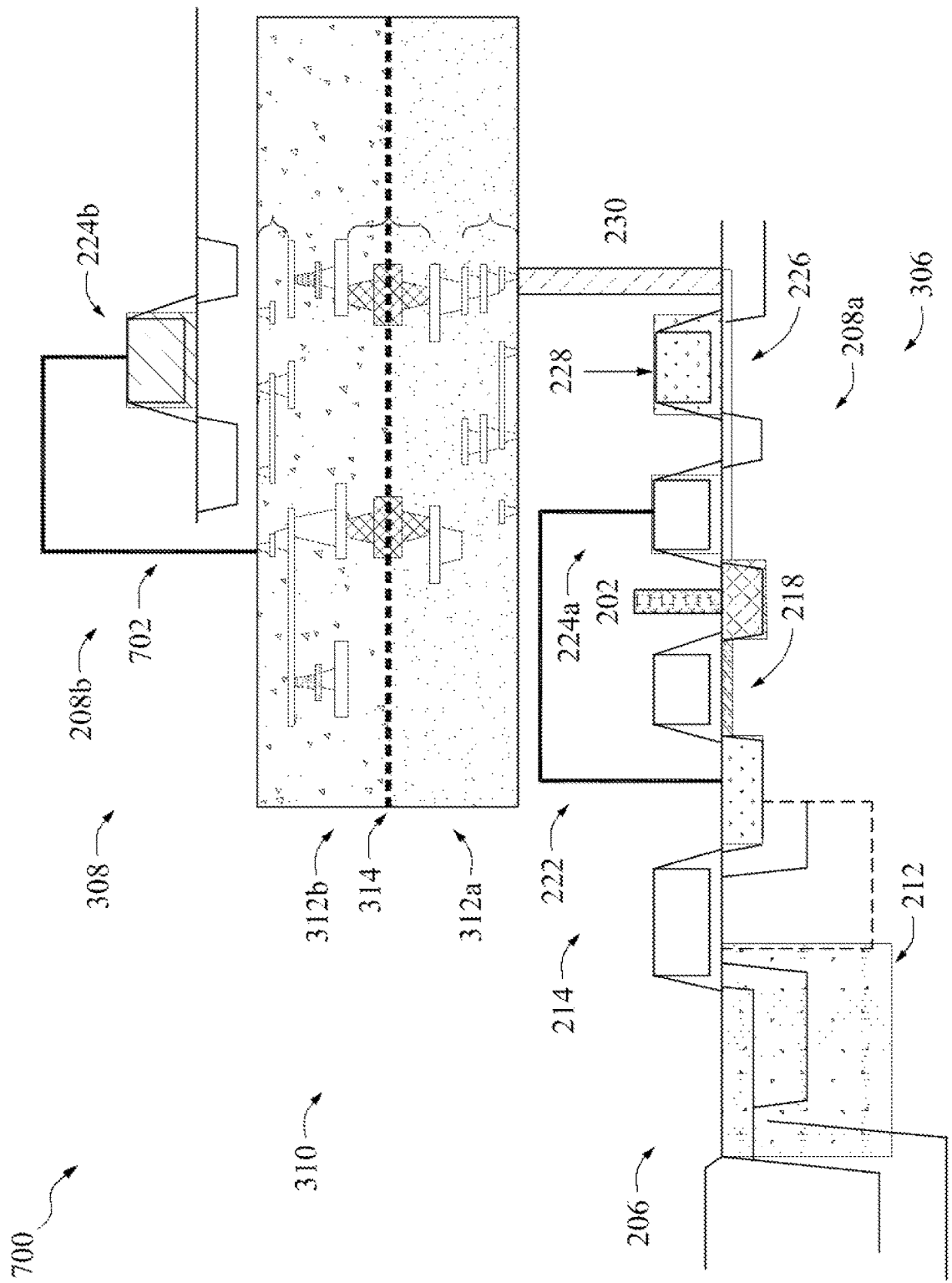
Figure 7B:
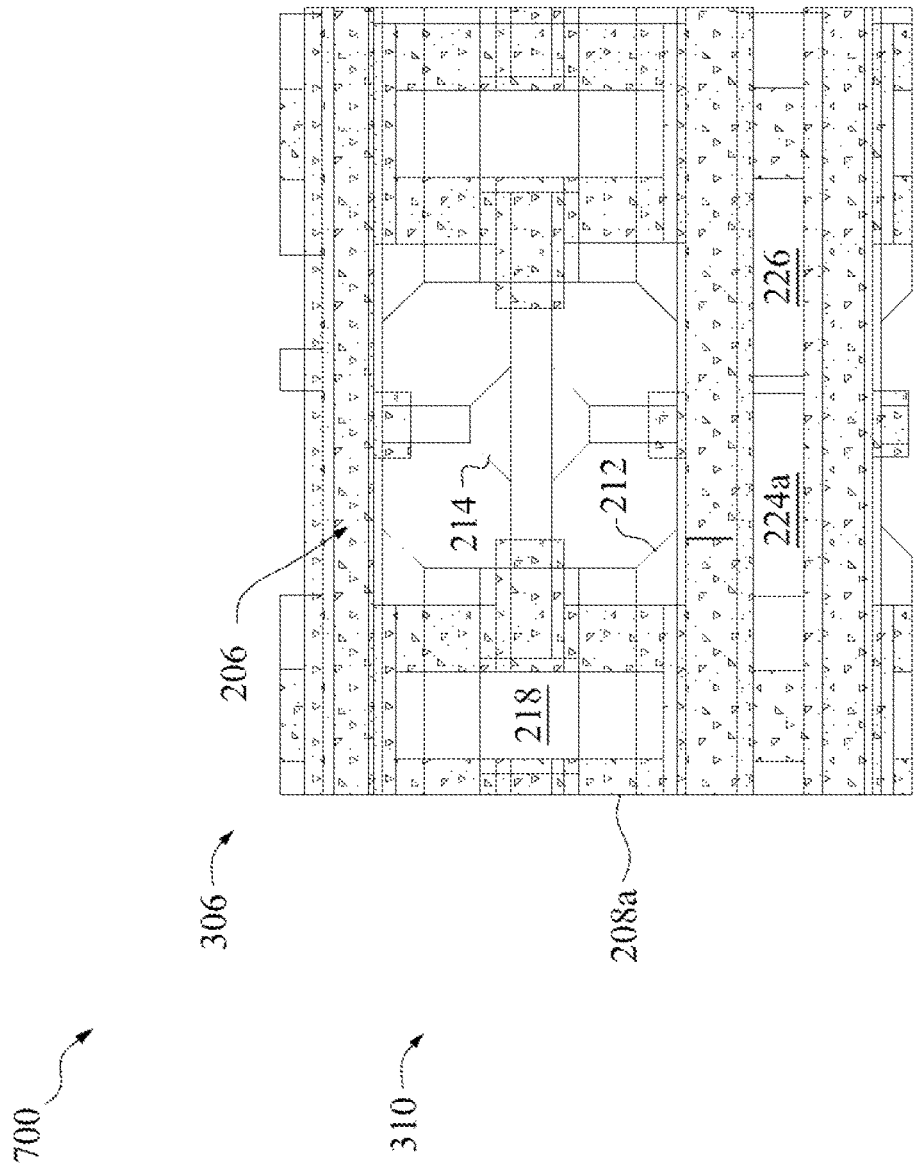

FIGS. 7A and 7B are diagrams of an example configuration 700 for an image sensor device 310 described herein. FIG. 7A is a cross-sectional view of the configuration 700. FIG. 7B is a top-down view of the configuration 700. In the configuration 700, the control circuitry region 208 of one or more pixel sensors 200 of the image sensor device 310 is split between the sensor die 306 of the image sensor device 310 and the circuitry die 308 of the image sensor device 310. In other words, a first portion 208a of the control circuitry region 208 is included on the sensor die 306 and a second portion 208b of the control circuitry region 208 is included on the circuitry die 308. This enables the sensing region 206 on the sensor die 306 to occupy a greater area of the sensor die 306 than if the entire control circuitry region 208 were included on the sensor die 306.

As shown in FIG. 7A, the configuration 700 is similar to the configuration 600 except that the row select transistor 226 is included in the first portion 208a of the control circuitry region 208 on the sensor die 306 instead of the second portion 208b of the control circuitry region 208 on the circuitry die 308. Moreover, the source follower transistor 224 is split into two portions: a first portion 224a of the source follower transistor 224 included in the first portion 208a of the control circuitry region 208 on the sensor die 306, and a second portion 224b of the source follower transistor 224 included in the second portion 208b of the control circuitry region 208 on the circuitry die 308. The first portion 224a of the source follower transistor 224 and the second portion 224b of the source follower transistor 224 may be electrically connected in parallel such that the first portion 224a of the source follower transistor 224 and the second portion of the source follower transistor 224 operate as a single transistor. This enables a portion of the source follower transistor 224 to be moved to the circuitry die 308, which provides an increased amount of area on the sensor die 306 for the photodiode 212. The two portions enable the source follower transistor 224 to still provide sufficient current drive and other performance parameters.

The floating diffusion voltage is provided to the gate of the second portion 224b of the source follower transistor 224 through the BEOL region 312a, the bonding region 314, and the BEOL region 312b to a contact 702 that is electrically connected with the gate.

As shown in FIG. 7B, the transfer transistor 214 may be located adjacent to and/or partially over the photodiode 212. The first portion 224a of the source follower transistor 224 and the row select transistor 226 may be located adjacent to a first side of the photodiode 212. The reset transistor 218 may be located adjacent to a second size of the photodiode 212. In some implementations, the first side and the second side are approximately orthogonal. In some implementations, the first side and the second side are opposite sides. In some implementations, the reset transistor 218 and the source follower transistor 224 are located adjacent to the same side of the photodiode 212. In some implementations, the row select transistor 226 and the first portion 224a of the source follower transistor 224 are located adjacent to different sides of the photodiode 212. In some implementations, the row select transistor 226 and the reset transistor 218 are located adjacent to different sides of the photodiode 212.

While the example configuration 700 is described in the context of a single pixel sensor 200, the image sensor device 310 may include a plurality of pixel sensors 200 arranged in a pixel array 316, where the pixel sensors 200 include the configuration 700.

As indicated above, FIGS. 7A and 7B are provided as examples. Other examples may differ from what is described with regard to FIGS. 7B and 7B.

Figure 8A:
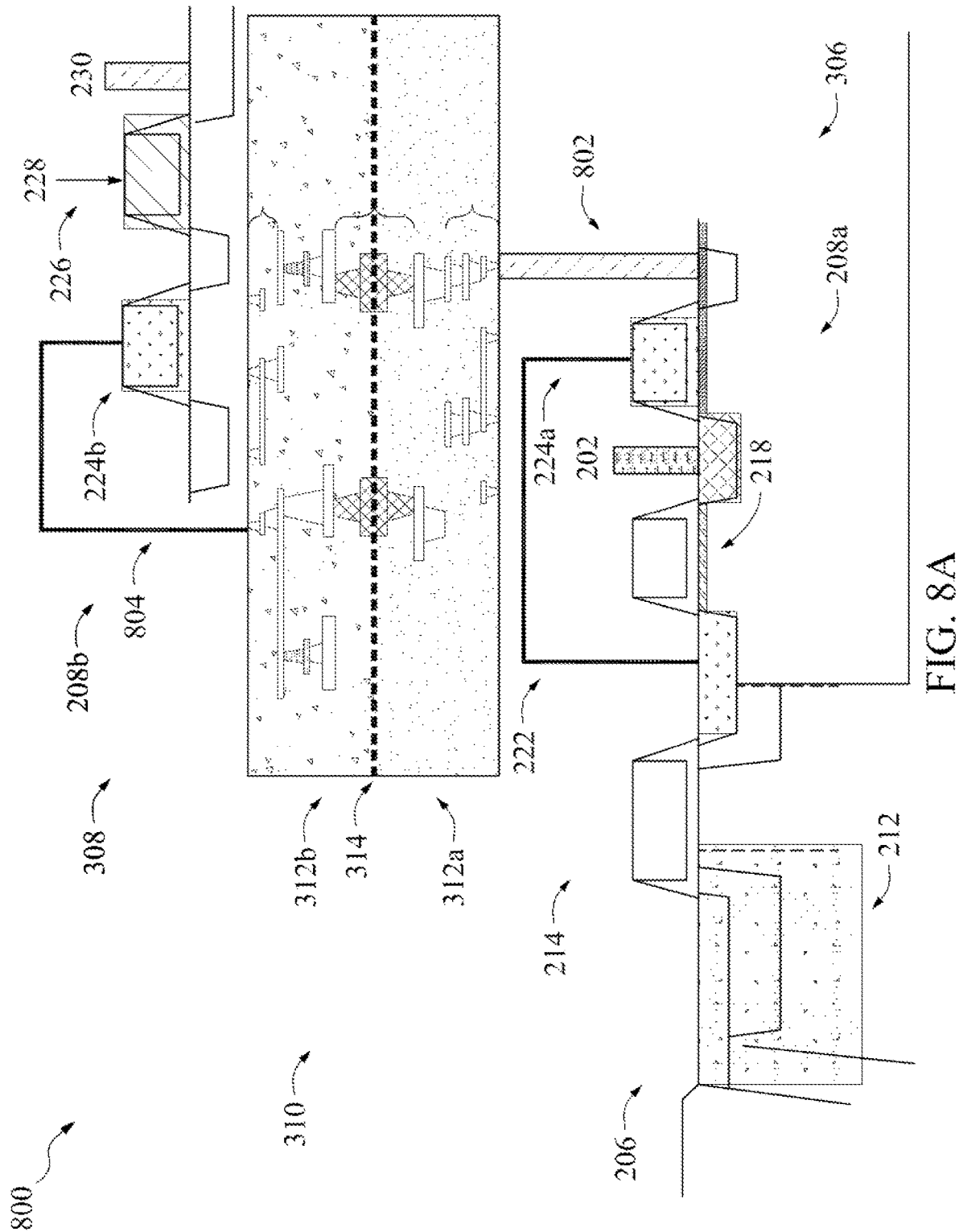
Figure 8B:
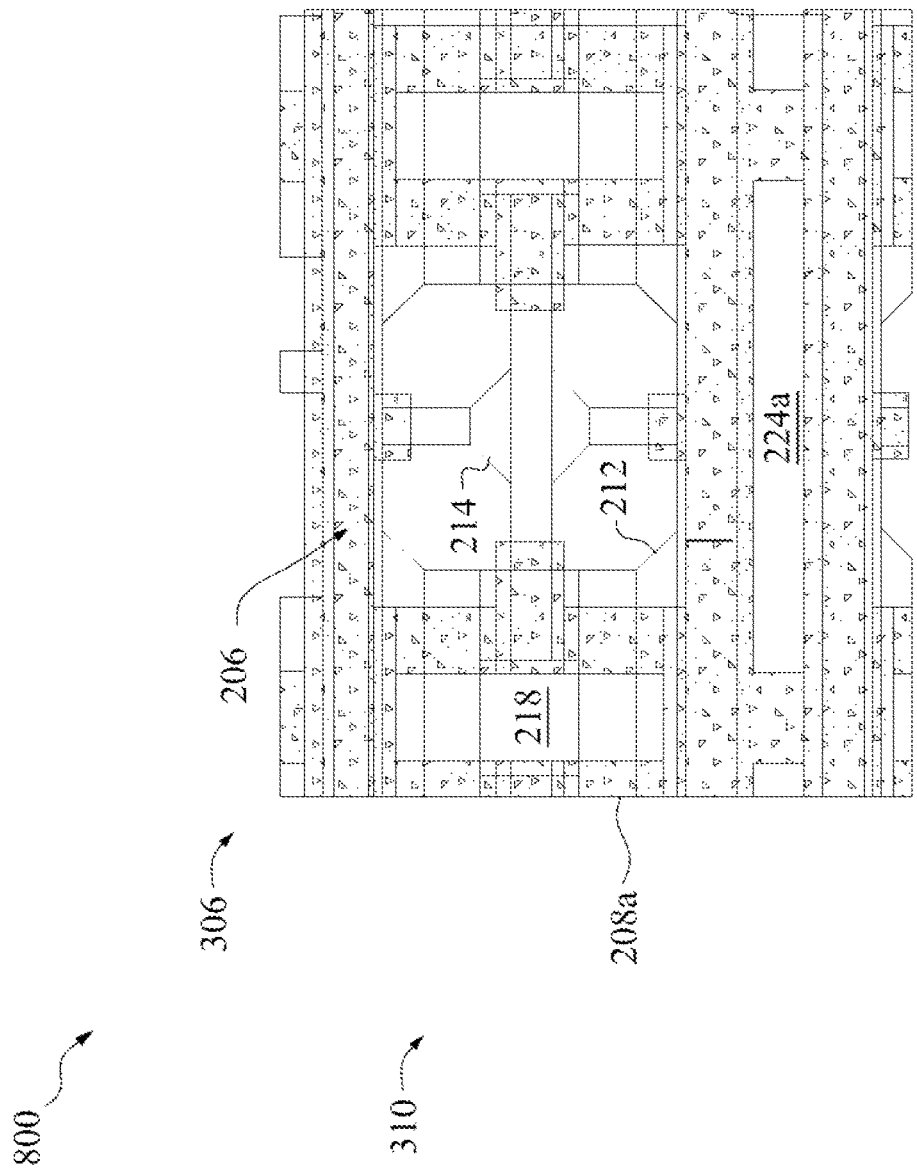

FIGS. 8A and 8B diagrams of an example configuration 800 for an image sensor device 310 described herein. FIG. 8A is a cross-sectional view of the configuration 800. FIG. 8B is a top-down view of the configuration 800. In the configuration 800, the control circuitry region 208 of one or more pixel sensors 200 of the image sensor device 310 is split between the sensor die 306 of the image sensor device 310 and the circuitry die 308 of the image sensor device 310. In other words, a first portion 208a of the control circuitry region 208 is included on the sensor die 306 and a second portion 208b of the control circuitry region 208 is included on the circuitry die 308. This enables the sensing region 206 on the sensor die 306 to occupy a greater area of the sensor die 306 than if the entire control circuitry region 208 were included on the sensor die 306.

As shown in FIG. 8A, the configuration 800 is similar to the configuration 600 except that the source follower transistor 224 is split into two portions: a first portion 224a of the source follower transistor 224 included in the first portion 208a of the control circuitry region 208 on the sensor die 306, and a second portion 224b of the source follower transistor 224 included in the second portion 208b of the control circuitry region 208 on the circuitry die 308. Accordingly, the second portion 224b of the source follower transistor 224 and the row select transistor 226 are both included in the second portion 208b of the control circuitry region 208 on the circuitry die 308 in the configuration 800. This further provides an increased amount of area on the sensor die 306 for the photodiode 212.

The first portion 224a of the source follower transistor 224 and the second portion 224b of the source follower transistor 224 may be electrically connected in parallel such that the first portion 224a of the source follower transistor 224 and the second portion of the source follower transistor 224 operate as a single transistor. The floating diffusion voltage is provided to the gate of the second portion 224b of the source follower transistor 224 through the BEOL region 312a, the bonding region 314, and the BEOL region 312b to a contact 702 that is electrically connected with the gate.

The output from the drain regions of the first portion 224a of the source follower transistor 224 and the second portion 224b of the source follower transistor 224 are provided to the source of the row select transistor 226 in the second portion 208b of the control circuitry region 208 on the circuitry die 308. The output from the first portion 224a of the source follower transistor 224 is provided to the source of the row select transistor 226 through the BEOL region 312a, the bonding region 314, and the BEOL region 312b. The output from the first portion 224a of the source follower transistor 224 is provided to the BEOL region 312a by an interconnect 802 and an interconnect 804.

As shown in FIG. 8B, the transfer transistor 214 may be located adjacent to and/or partially over the photodiode 212. The first portion 224a of the source follower transistor 224 may be located adjacent to a first side of the photodiode 212. The reset transistor 218 may be located adjacent to a second size of the photodiode 212. In some implementations, the first side and the second side are approximately orthogonal. In some implementations, the first side and the second side are opposite sides. In some implementations, the reset transistor 218 and the first portion 224a of the source follower transistor 224 are located adjacent to the same side of the photodiode 212.

While the example configuration 800 is described in the context of a single pixel sensor 200, the image sensor device 310 may include a plurality of pixel sensors 200 arranged in a pixel array 316, where the pixel sensors 200 include the configuration 800.

As indicated above, FIGS. 8A and 8B are provided as examples. Other examples may differ from what is described with regard to FIGS. 8B and 8B.

A configuration from the example configurations 600-800 described herein may be selected to optimize and/or maximize the area for a sensing region of a pixel sensor (or the sensing regions for a plurality of pixel sensors in a pixel array) of an image sensor device while providing sufficient operating performance for switching speed, operating speed, response times, and/or signal to noise ratio (SNR), among other examples.

As an example, the example configuration 600 may be selected in implementations in which a row select transistor 226 (or row select transistors 226) is physically larger and occupies a greater area relative to a source follower transistor 224 (or source follower transistors 224). In these implementations, moving the row select transistor 226 to a circuitry die 308 of an image sensor device 310 instead of the source follower transistor 224 to provide a greater increase in available area for a photodiode 212 (or photodiodes 212) on a sensor die 306 of the image sensor device 310. However, the example configuration 600 may be used in other implementations.

As another example, the example configuration 700 may be selected in implementations in which a source follower transistor 224 (or source follower transistors 224) are physically larger and occupy a greater area relative to a row select transistor 226 (or row select transistors 226). In these implementations, moving a portion of the source follower transistor 224 to a circuitry die 308 of an image sensor device 310 instead of the source follower transistor 224 to provide a greater increase in available area for a photodiode 212 (or photodiodes 212) on a sensor die 306 of the image sensor device 310. However, the example configuration 700 may be used in other implementations.

As another example, the example configuration 800 may be selected in implementations in which the size of the photodiode 212 (or photodiodes 212) of an image sensor device 310 may be prioritized over switching speed, operating speed, response times, and/or signal to noise ratio (SNR), among other examples. In these implementations, moving row select transistor 226 and a portion of the source follower transistor 224 to a circuitry die 308 of the image sensor device 310 may provide a greater increase in available area for the photodiode 212 (or photodiodes 212) on a sensor die 306 of the image sensor device 310. However, the example configuration 800 may be used in other implementations.

Figure 9:
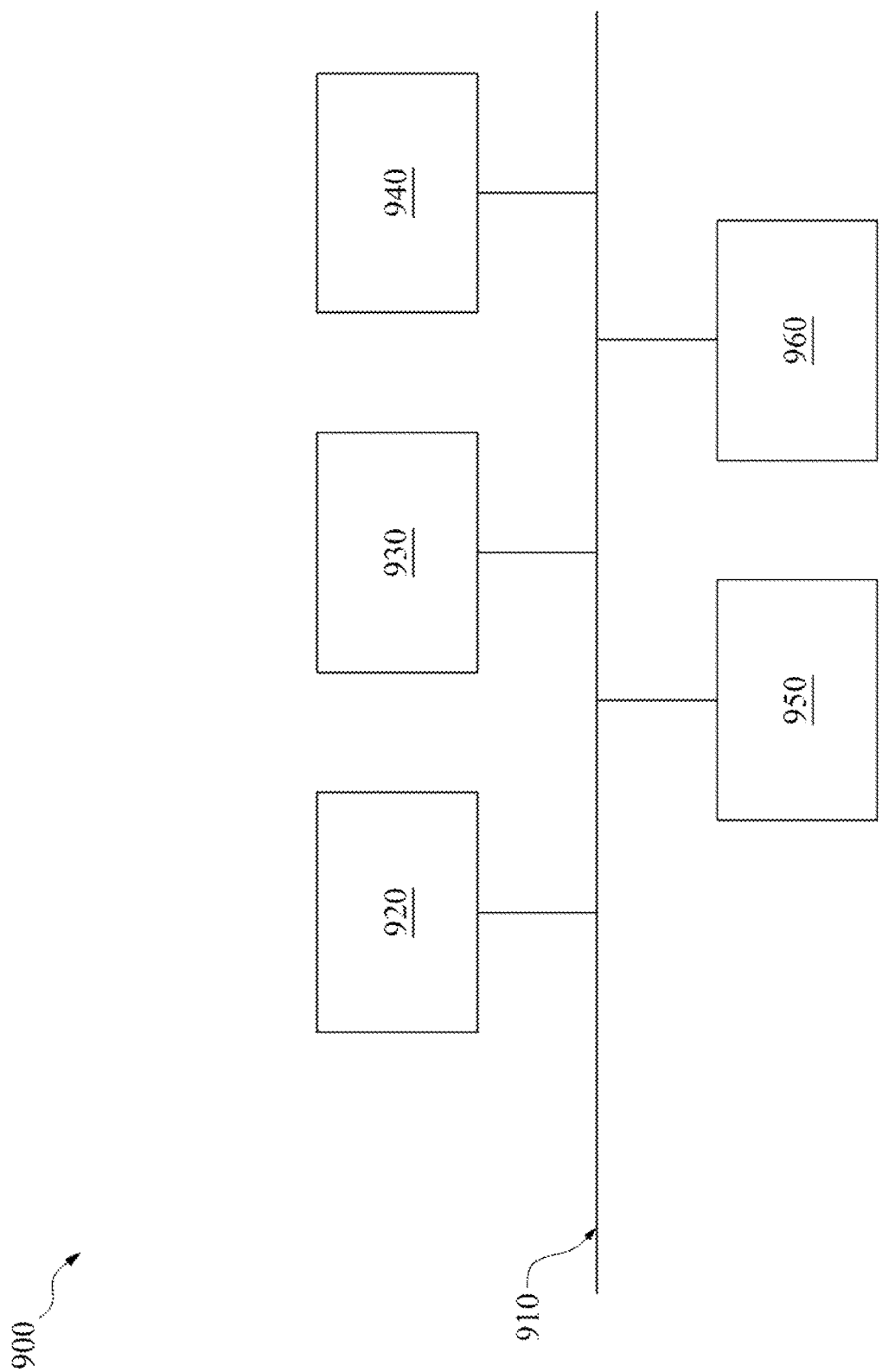
FIG. 9 is a diagram of example components of one or more devices of FIG. 1 described herein.

FIG. 9 is a diagram of example components of a device 900. In some implementations, one or more of the semiconductor processing tools 102-116 and/or the wafer/die transport tool 118 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
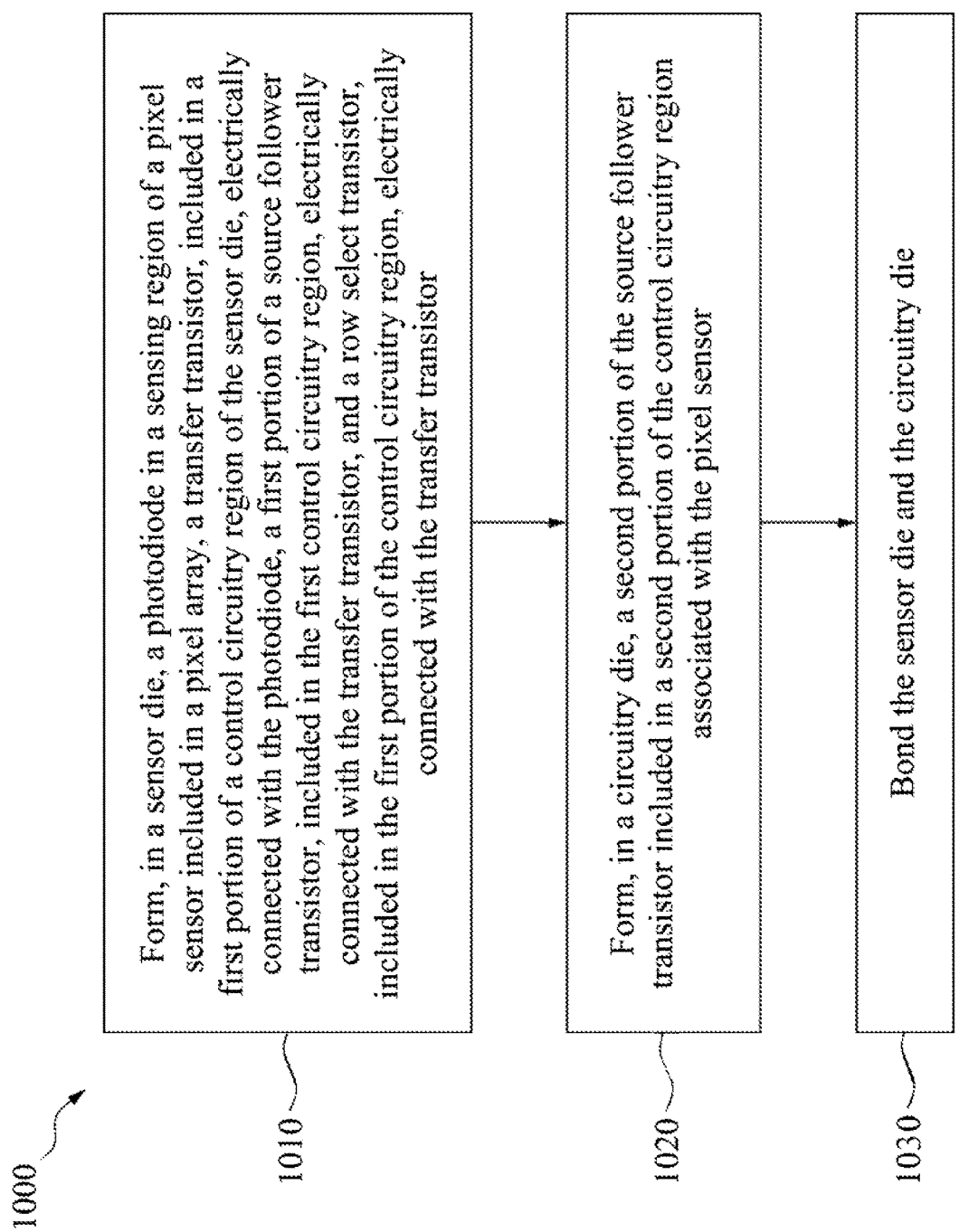
FIG. 10 is a flowchart of an example process associated with forming a stacked image sensor.

FIG. 10 is a flowchart of an example process 1000 associated with forming a stacked image sensor. In some implementations, one or more process blocks of FIG. 10 are performed by one or more semiconductor processing tools (e.g., one or more of the semiconductor processing tools 102-116). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming, in a sensor die, a photodiode in a sensing region of a pixel sensor included in a pixel array, a transfer transistor, included in a first portion of a control circuitry region of the sensor die, electrically connected with the photodiode, a first portion of a source follower transistor, included in the first portion of the control circuitry region, electrically connected with the transfer transistor, and a row select transistor, included in the first portion of the control circuitry region, electrically connected with the first portion of the source follower transistor (block 1010). For example, one or more of the semiconductor processing tools 102-116 may form, in a sensor die 306, a photodiode 212 in a sensing region 206 of a pixel sensor 200 included in a pixel array 316, a transfer transistor 214, included in a first portion 208a of a control circuitry region 208 of the sensor die 306, electrically connected with the photodiode 212, a first portion 224a of a source follower transistor 224, included in the first portion 208a of the control circuitry region 208, electrically connected with the transfer transistor 214; and a row select transistor 226, included in the first portion 208a of the control circuitry region 208, electrically connected with the first portion 224a of the source follower transistor 224, as described herein.

As further shown in FIG. 10, process 1000 may include forming, in a circuitry die, a second portion of the source follower transistor included in a second portion of the control circuitry region associated with the pixel sensor (block 1020). For example, one or more of the semiconductor processing tools 102-116 may form, in a circuitry die 308 a second portion 224b of the source follower transistor 224 included in a second portion 208b of the control circuitry region 208 associated with the pixel sensor 200, as described herein.

As further shown in FIG. 10, process 1000 may include bonding the sensor die and the circuitry die (block 1030). For example, one or more of the semiconductor processing tools 102-116 may bond the sensor die 306 and the circuitry die 308, as described herein.

Process 1000 may include additional implementations, such as any single implementation or any combination of implementations described below and/or in connection with one or more other processes described elsewhere herein.

In a first implementation, process 1000 includes forming a connection between a drain of the transfer transistor 214 and a gate of the first portion 224a of the source follower transistor 224. In a second implementation, alone or in combination with the first implementation, process 1000 includes forming a connection between a drain of the transfer transistor 214 and a gate of the second portion 224b of the source follower transistor 224. In a third implementation, alone or in combination with one or more of the first and second implementations, forming the connection between the drain of the transfer transistor 214 and the gate of the second portion 224b of the source follower transistor 224 includes forming the connection between the drain of the transfer transistor 214 and the gate of the second portion 224b of the source follower transistor 224 through a BEOL region 312a of the sensor die 306 and a BEOL region 312b of the circuitry die 308.

In a fourth implementation, alone or in combination with one or more of the first through third implementations, process 1000 includes forming an output contact (e.g., an output 230) for the pixel sensor 200 on the sensor die 306 in the first portion 208a of the control circuitry region 208. In a fifth implementation, alone or in combination with one or more of the first through fourth implementations, process 1000 includes forming a connection between a drain of the first portion 224a of the source follower transistor 224 and a source of the row select transistor 226. In a sixth implementation, alone or in combination with one or more of the first through fifth implementations, the drain of the first portion 224a of the source follower transistor 224 and the source of the row select transistor 226 include a same n-doped region in a substrate 402 of the sensor die 306.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

In this way, one or more transistors of a pixel sensor are included on a circuitry die (e.g., an ASIC die or another type of circuitry die) of an image sensor device. The one or more transistors may include a source follower transistor, a row select transistor, and/or another transistor that is used to control the operation of the pixel sensor. Including the one or more transistors of the pixel sensor (and other pixel sensors of the image sensor device) on the circuitry die reduces the area occupied by transistors in the pixel sensor on the sensor die. This enables the area for photon collection in the pixel sensor to be increased.

As described in greater detail above, some implementations described herein provide an image sensor device. The image sensor device includes a sensor die. The sensor die includes a pixel sensor. The pixel sensor includes a sensing region that includes a photodiode and a first portion of a control circuitry region. The image sensor device includes a circuitry die. The sensor die and the circuitry die are bonded at an interface region. The circuitry die includes a second portion of the control circuitry region associated with the pixel sensor. The second portion of the control circuitry region includes a row select transistor of the pixel sensor.

As described in greater detail above, some implementations described herein provide a method. The method includes forming, in a sensor die, a photodiode in a sensing region of a pixel sensor included in a pixel array. The method includes forming a transfer transistor, included in a first portion of a control circuitry region of the sensor die, electrically connected with the photodiode. The method includes forming a first portion of a source follower transistor, included in the first portion of the control circuitry region, electrically connected with the transfer transistor. The method includes forming a row select transistor, included in the first portion of the control circuitry region, electrically connected with the transfer transistor. The method includes forming, in a circuitry die, a second portion of the source follower transistor included in a second portion of the control circuitry region associated with the pixel sensor. The method includes bonding the sensor die and the circuitry die.

As described in greater detail above, some implementations described herein provide an image sensor device. The image sensor device includes a sensor die. The sensor die includes a pixel sensor. The pixel sensor includes a sensing region that includes a photodiode and a first portion of the control circuitry region including a first portion of a source follower transistor of the pixel sensor. The image sensor device includes a circuitry die. The sensor die and the circuitry die are bonded at an interface region. The circuitry die includes a second portion of the control circuitry region associated with the pixel sensor. The second portion of the control circuitry region includes a row select transistor of the pixel sensor and a second portion of the source follower transistor of the pixel sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a sensor die, comprising:
      a pixel sensor, comprising:
         a sensing region that includes a photodiode; and
         a first portion of a control circuitry region; and
   a circuitry die,
      wherein the sensor die and the circuitry die are bonded at an interface region, and
      wherein the circuitry die comprises:
         a second portion of the control circuitry region associated with the pixel sensor,
            wherein the second portion of the control circuitry region includes a row select transistor of the pixel sensor.

2. The image sensor device of claim 1, wherein the pixel sensor is included in a pixel array that includes a plurality of pixel sensors.

3. The image sensor device of claim 1, wherein a width of the pixel sensor on the sensor die is in a range of approximately 0.6 microns to approximately 0.7 microns.

4. The image sensor device of claim 1, wherein the first portion of the control circuitry region comprises:
   a source follower transistor; and
   wherein the row select transistor is electrically connected with the source follower transistor.

5. The image sensor device of claim 4, wherein the row select transistor is electrically connected with the source follower transistor through a back end of line (BEOL) region of the sensor die and a BEOL region of the circuitry die.

6. The image sensor device of claim 4, wherein a drain region of the source follower transistor is electrically connected with a source of the row select transistor through a bonding interface between the sensor die and the circuitry die.

7. The image sensor device of claim 4, wherein the source follower transistor is located along a first side of the photodiode; and
   wherein a reset transistor of the first portion of the control circuitry region is located along a second side of the photodiode,
      wherein the first side and the second side are approximately orthogonal sides of the photodiode.

8. An image sensor device, comprising:
   a sensor die, comprising:
      a pixel sensor, comprising:
         a sensing region that includes a photodiode; and
         a first portion of a control circuitry region including a first portion of a source follower transistor of the pixel sensor; and
   a circuitry die,
      wherein the sensor die and the circuitry die are bonded at an interface region, and
      wherein the circuitry die comprises:
         a second portion of the control circuitry region associated with the pixel sensor,
            wherein the second portion of the control circuitry region includes:
               a row select transistor of the pixel sensor, and
               a second portion of the source follower transistor of the pixel sensor.

9. The image sensor device of claim 8, wherein a drain region of the first portion of the source follower transistor and a gate of the second portion of the source follower transistor are electrically connected through a back end of line (BEOL) region of the sensor die and a BEOL region of the circuitry die.

10. The image sensor device of claim 8, wherein the first portion of the control circuitry region includes:
    a transfer transistor; and
    a reset transistor,
       wherein a drain region of the transfer transistor and a gate of the first portion of the source follower transistor are electrically connected.

11. The image sensor device of claim 10, wherein a drain region of the reset transistor and a source region of the first portion of the source follower transistor include a same n-doped region.

12. The image sensor device of claim 8, wherein the second portion of the control circuitry region includes an output contact of the pixel sensor.

13. The image sensor device of claim 12, wherein the output contact is electrically connected with a drain of the row select transistor on the circuitry die.

14. A device, comprising:
    a sensor die, comprising:
       a photodiode in a sensing region of a pixel sensor included in a pixel array;
       a transfer transistor, included in a first portion of a control circuitry region, coupled with the photodiode;
       a first portion of a source follower transistor, included in the first portion of the control circuitry region, coupled with the transfer transistor; and
       a row select transistor, included in the first portion of the control circuitry region, coupled with the first portion of the source follower transistor; and
    a circuitry die, comprising:
       a second portion of the source follower transistor included in a second portion of the control circuitry region associated with the pixel sensor,
       wherein the sensor die is bonded with the circuitry die.

15. The device of claim 14, wherein a drain of the transfer transistor is coupled with a gate of the first portion of the source follower transistor.

16. The device of claim 14, wherein a drain of the transfer transistor is coupled with a gate of the second portion of the source follower transistor.

17. The device of claim 16, wherein a connection between the drain of the transfer transistor and the gate of the second portion of the source follower transistor is through a back end of line (BEOL) region of the sensor die and a BEOL region of the circuitry die.

18. The device of claim 14, further comprising:
    an output contact for the pixel sensor on the sensor die in the first portion of the control circuitry region.

19. The device of claim 14, wherein a drain of the first portion of the source follower transistor is coupled with a source of the row select transistor.

20. The device of claim 19, wherein the drain of the first portion of the source follower transistor and the source of the row select transistor comprise a same n-doped region in a substrate of the sensor die.

* * * * *